(12) United States Patent
Ootorii

(10) Patent No.: US 8,780,023 B2
(45) Date of Patent: Jul. 15, 2014

(54) PIXEL CHIP, DISPLAY PANEL, LIGHTING PANEL, DISPLAY UNIT, AND LIGHTING UNIT

(75) Inventor: Hiizu Ootorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 137 days.

(21) Appl. No.: 13/422,508

(22) Filed: Mar. 16, 2012

(65) Prior Publication Data

US 2012/0256814 A1    Oct. 11, 2012

(30) Foreign Application Priority Data

Apr. 8, 2011  (JP) ................................. 2011-086825

(51) Int. Cl.
G09G 3/32           (2006.01)

(52) U.S. Cl.
USPC .......................................................... 345/82

(58) Field of Classification Search
CPC ....... G09G 3/32; G09G 3/30; G09G 2360/16; G09G 3/3426; G09G 3/3648
USPC ........................................... 345/82, 80, 102
See application file for complete search history.

(56) References Cited

U.S. PATENT DOCUMENTS

| 4,869,566 | A  | * | 9/1989  | Juso et al. .................... 385/53 |
| 5,177,405 | A  | * | 1/1993  | Kusuda et al. ............. 315/169.1 |
| 7,804,338 | B2 | * | 9/2010  | Nagumo ....................... 327/108 |
| 8,054,283 | B2 | * | 11/2011 | Lee et al. ...................... 345/102 |
| 8,093,828 | B2 | * | 1/2012  | Nagumo ....................... 315/291 |
| 8,094,102 | B2 | * | 1/2012  | Huang ............................ 345/83 |
| 8,344,410 | B2 | * | 1/2013  | Wendler et al. ................. 257/99 |
| 8,456,092 | B2 | * | 6/2013  | Knapp .......................... 315/152 |
| 8,521,035 | B2 | * | 8/2013  | Knapp et al. .................. 398/172 |
| 8,547,023 | B2 | * | 10/2013 | Chang et al. .................. 315/130 |

FOREIGN PATENT DOCUMENTS

JP       2009-272591       11/2009

* cited by examiner

*Primary Examiner* — Fred Tzeng
(74) *Attorney, Agent, or Firm* — Rader, Fishman & Grauer PLLC

(57) ABSTRACT

There are provided a pixel chip capable of preventing false lighting of a light emitting device, a display panel including the pixel chip as a pixel, a lighting panel including the pixel chip as a pixel, a display unit including the display panel, and a lighting unit including the lighting panel. The pixel chip includes: one or a plurality of light emitting devices; a driver IC driving the light emitting devices; a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

20 Claims, 29 Drawing Sheets

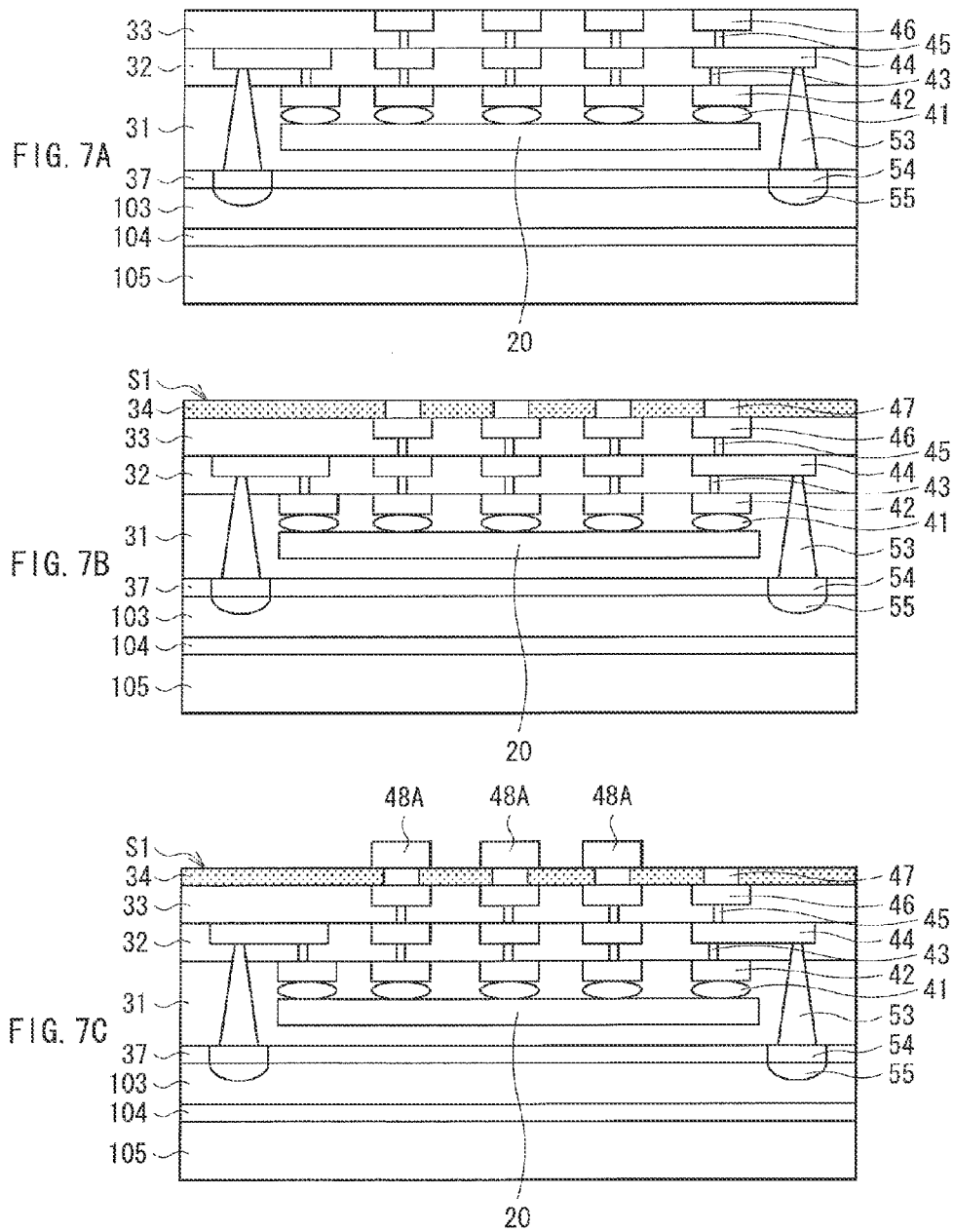

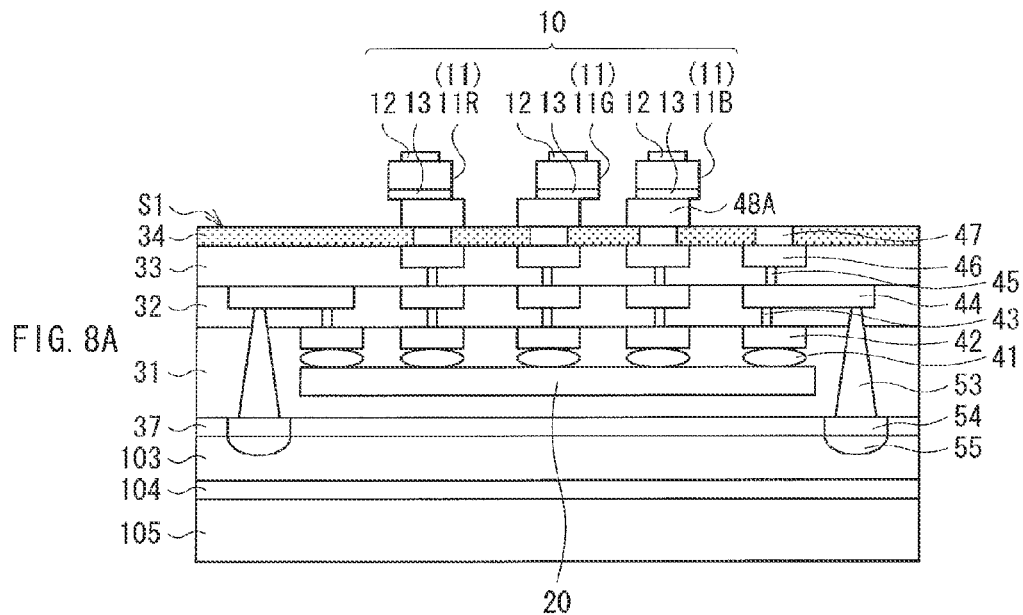
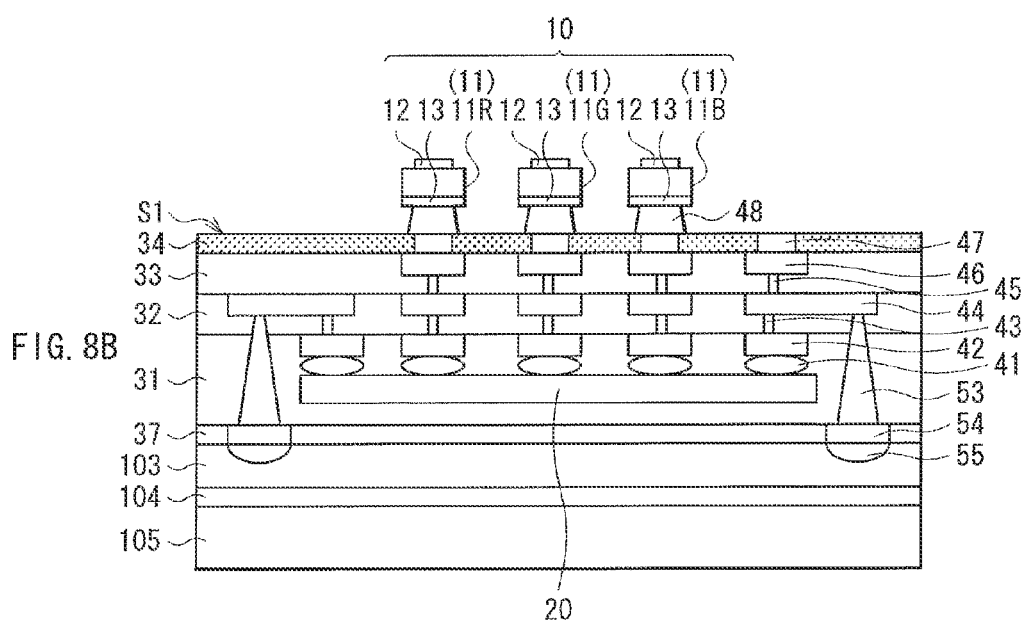

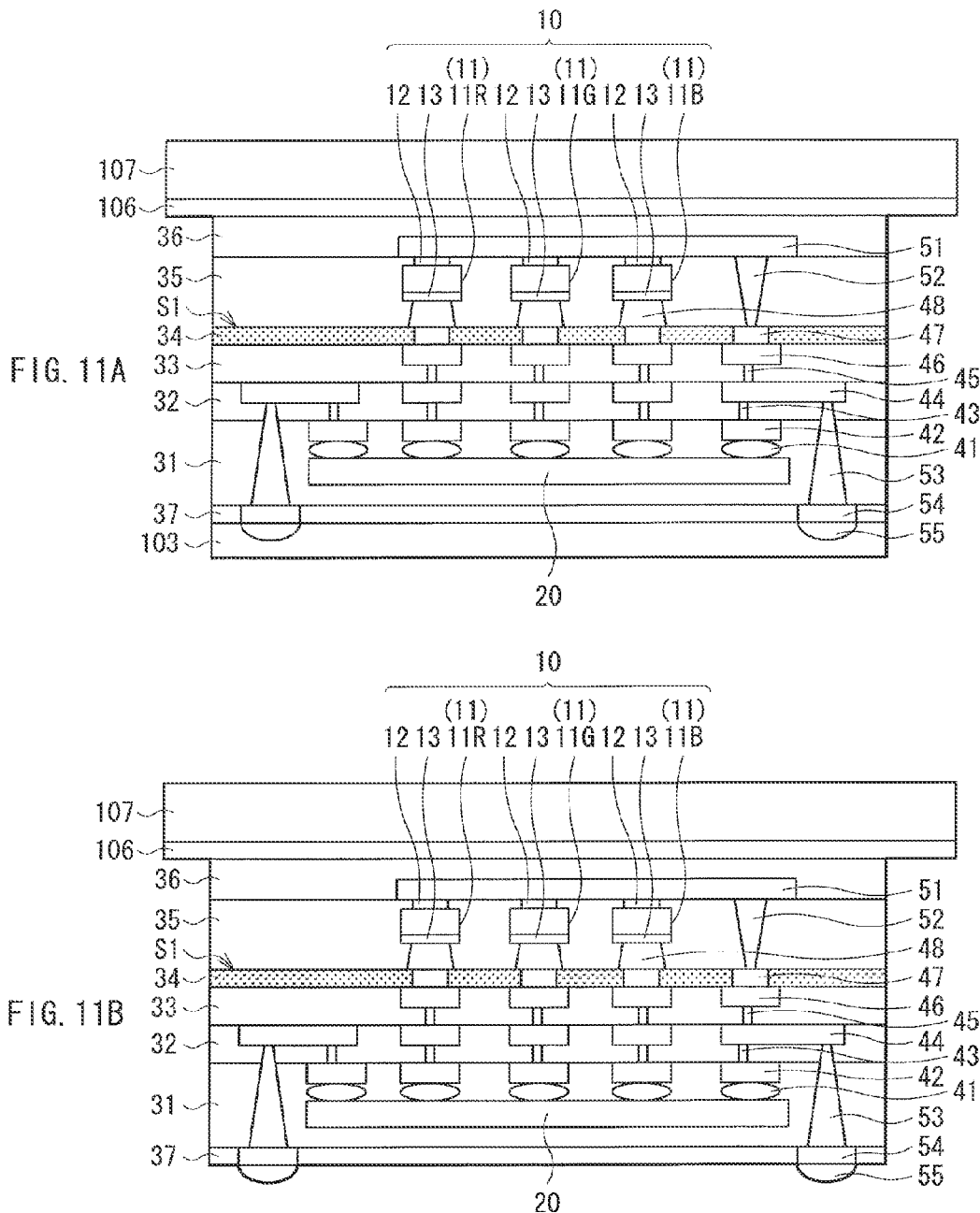

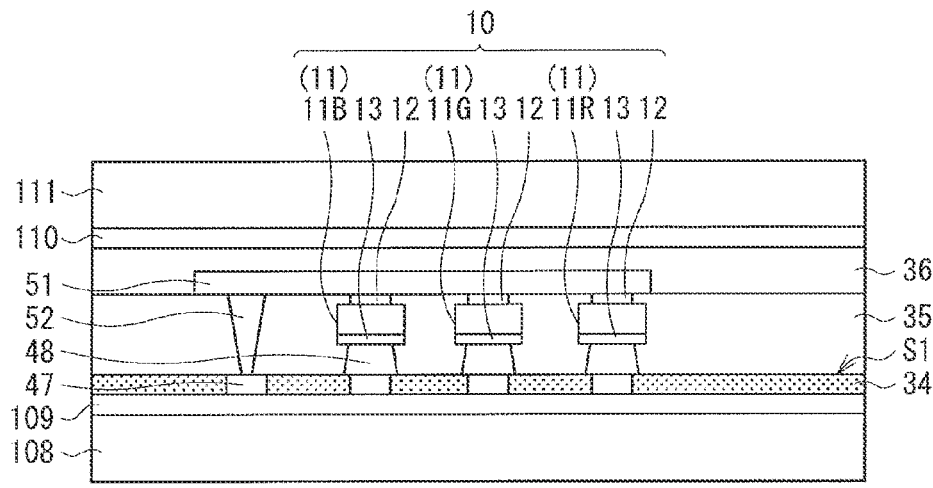
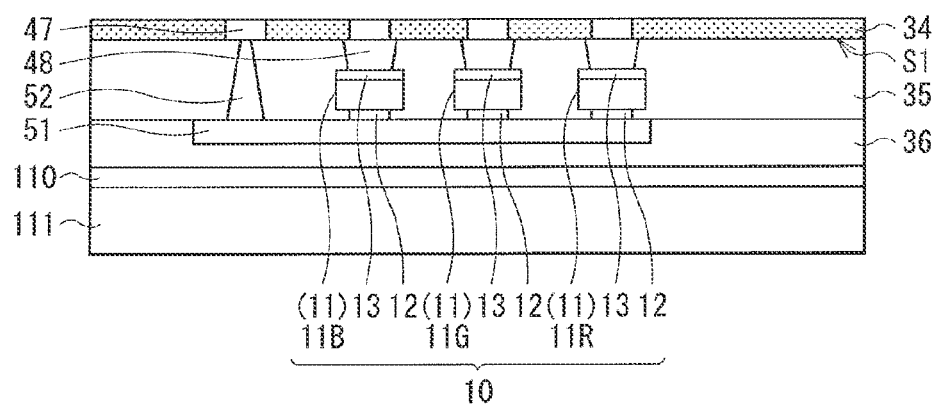

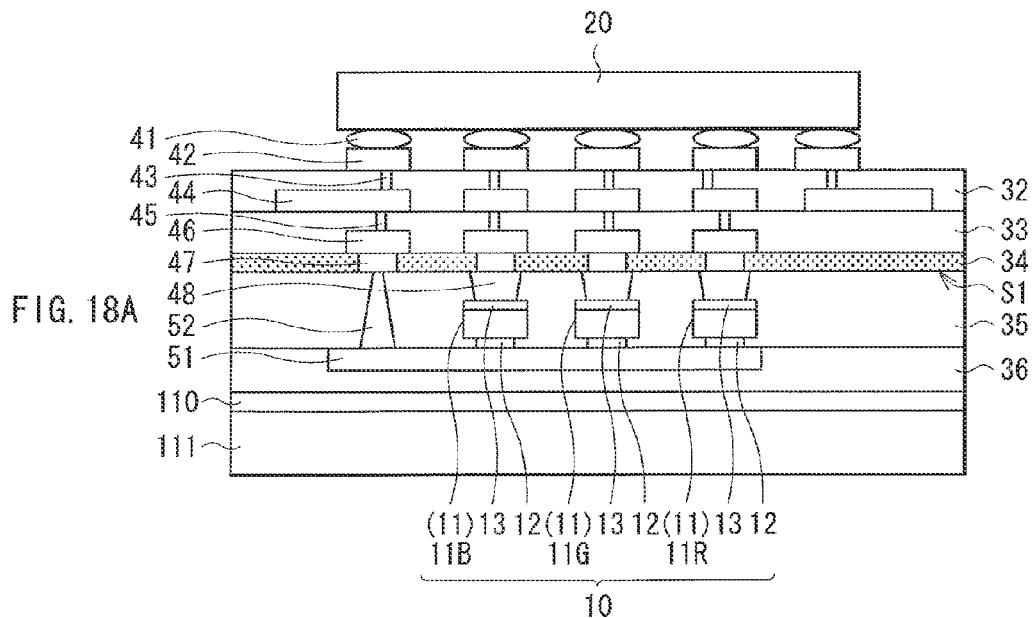
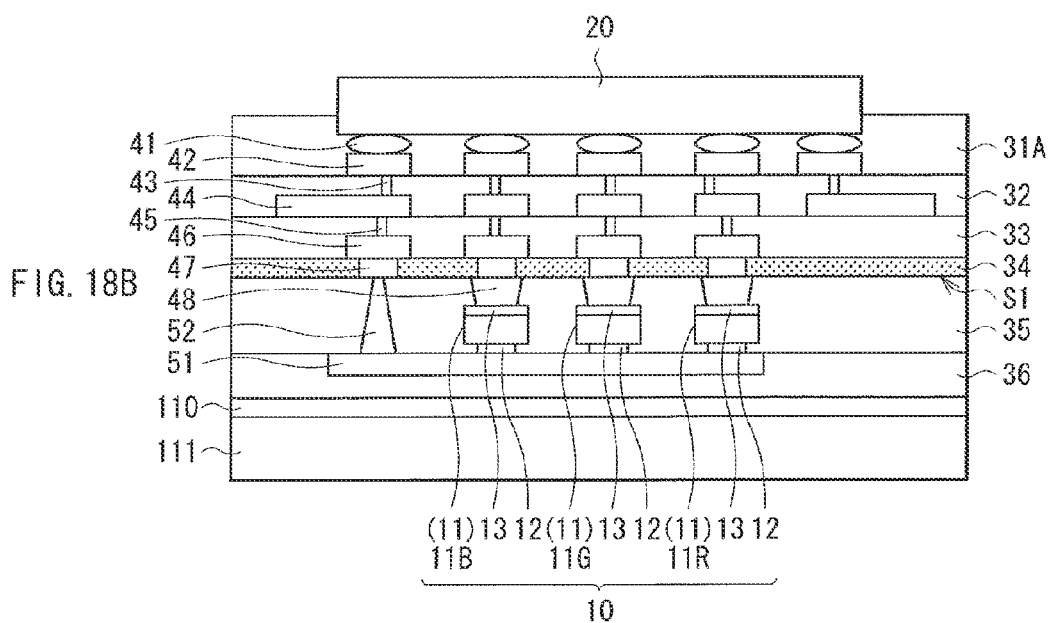

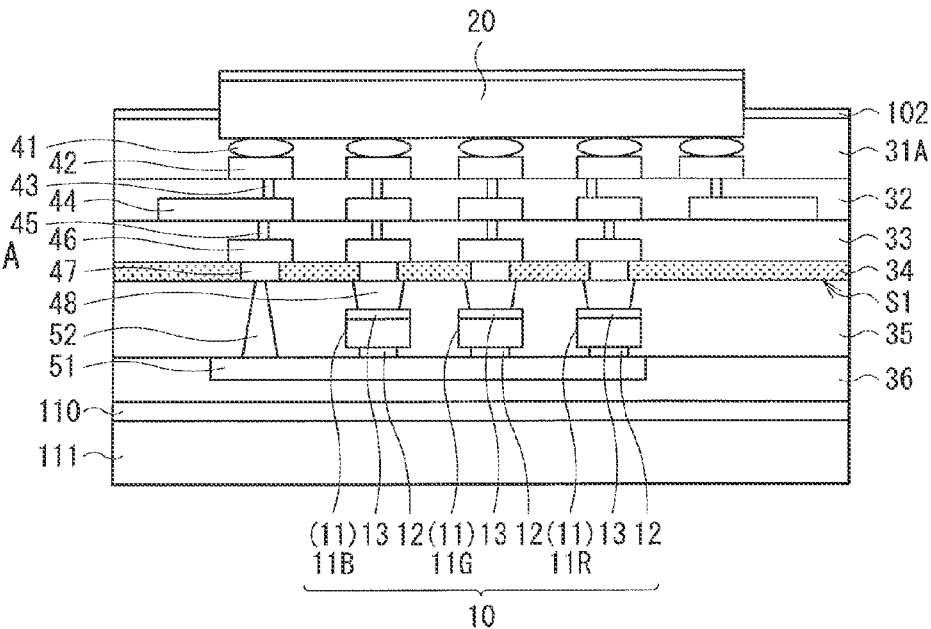
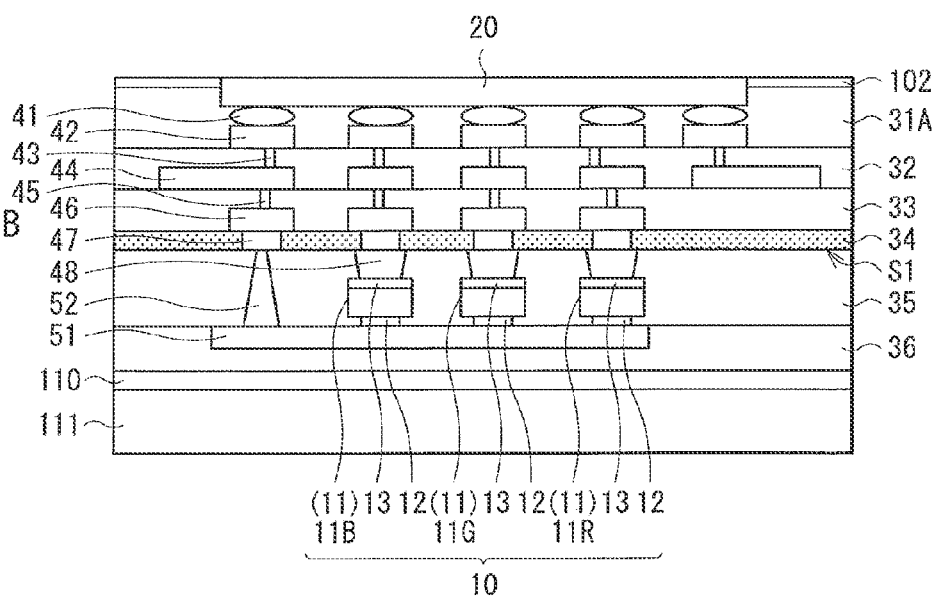

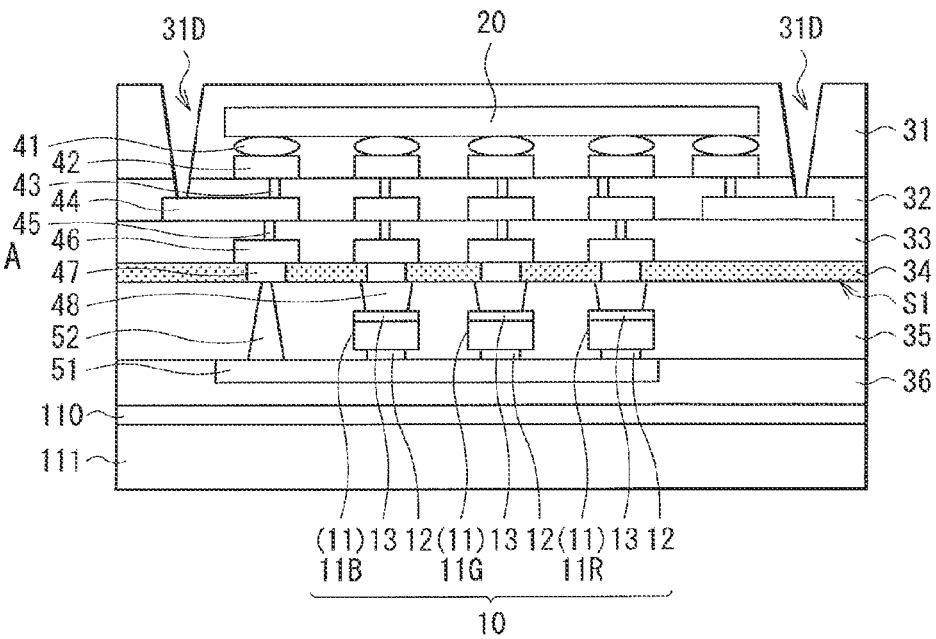
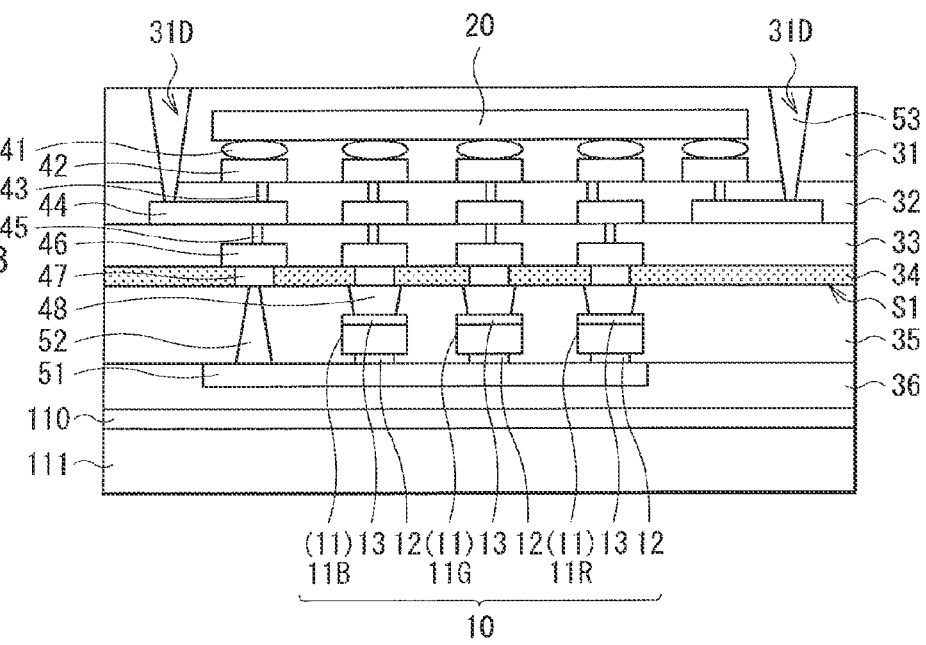

PIXEL CHIP, DISPLAY PANEL, LIGHTING PANEL, DISPLAY UNIT, AND LIGHTING UNIT

BACKGROUND

The present technology relates to a pixel chip for active matrix driving, a display panel including the same, and a lighting panel including the same. The present technology further relates to a display unit including the foregoing display panel and a lighting unit including the foregoing lighting panel.

In recent years, as a light-weight and thin display, LED displays using a light emitting diode (LED) as a display pixel have attracted attentions (see Japanese Unexamined Patent Application Publication No. 2009-272591). The LED displays are characterized in that view angle dependency in which contrast and color shade are changed according to a view angle does not exist and a reaction rate in the case of changing color is high.

SUMMARY

Driving systems of the LED displays include simple (passive) matrix system and active matrix system as in liquid crystal display units. In the former system, though the structure is simple, there is a disadvantage that in the case of a large display, high luminance is not easily obtained since its voltage is decreased due to a wiring resistance. Meanwhile, in the latter system, a current flowing in the LED is controlled by an active device (in general, a TFT (Thin Film Transistor)) for each pixel, and therefore its voltage is not decreased due to a wiring resistance and high luminance is able to be easily obtained.

The foregoing TFT is built in a driver IC provided for each pixel. The driver IC is built in a pixel chip together with the LED, and, for example, is arranged in the same plane as that of the LED. As described above, the pixel chip has a structure in which light emitted from the LED easily enters the driver IC. Therefore, there has been a disadvantage that the light emitted from the LED enters the driver IC, the TFT in the driver IC malfunctions, and a current turning on the LED flows unintentionally.

It is desirable to provide a pixel chip capable of preventing false lighting of a light emitting device, a display panel and a lighting panel which include the pixel chip as a pixel, a display unit including the display panel, and a lighting unit including the lighting panel.

According to an embodiment of the present technology, there is provided a pixel chip including one or a plurality of light emitting devices; a driver IC driving the light emitting devices; a connection section that is arranged between the light emitting device and the driver IC, and electrically connects the light emitting device to the driver IC; and a light shielding section that is arranged between the light emitting device and the driver IC, and blocks direct entrance of light emitted from each of the light emitting devices into the driver IC together with the connection section.

According to an embodiment of the present technology, there is provided a display panel including a plurality of pixel chips two-dimensionally arranged on a wiring substrate in a display region. Each of the pixel chips included in the display panel includes one or a plurality of light emitting devices; a driver IC driving the light emitting device; a first connection section that is arranged between the light emitting devices and the driver IC, and electrically connects the light emitting devices to the driver IC; and a first light shielding section that is arranged between the light emitting devices and the driver IC, and blocks direct entrance of light emitted from each of the light emitting devices into the driver IC together with the first connection section.

According to an embodiment of the present technology, there is provided a lighting panel including a plurality of pixel chips two-dimensionally arranged on a wiring substrate in a lighting region. Each of the pixel chips included in the lighting panel includes one or a plurality of light emitting devices; a driver IC driving the light emitting devices; a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

According to an embodiment of the present technology, there is provided a display unit including a display panel having a plurality of pixel chips two-dimensionally arranged on a wiring substrate in a display region and a drive circuit that drives the pixel chips. Each of the pixel chips included in the display unit includes one or a plurality of light emitting devices; a driver IC driving the light emitting devices; a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

According to an embodiment of the present technology, there is provided a lighting unit including a lighting panel having a plurality of pixel chips two-dimensionally arranged on a wiring substrate in a lighting region and a drive circuit that drives the pixel chips. Each of the pixel chips included in the lighting unit includes one or a plurality of light emitting devices; a driver IC driving the light emitting devices; a connection section that is arranged between the light emitting devices and the driver IC, and electrically connects the light emitting device to the driver IC; and a light shielding section that is arranged between the light emitting devices and the driver IC, and blocks direct entrance of light emitted from each of the light emitting devices into the driver IC together with the connection section.

In the pixel chip, the display panel, the lighting panel, the display unit, and the lighting unit according to the embodiments of the present technology, the light shielding section that blocks direct entrance of light emitted from the light emitting device into the driver IC is provided between the first surface as a mounting surface of the light emitting device and the driver IC. Thereby, occurrence of false operation of the driver IC caused by the light emitted from the light emitting device is able to be decreased.

In the embodiments of the present technology, the light shielding section is made of, for example, a resin added with a light-absorbing material. Further, in the embodiments of the present technology, a columnar electric conductor that is electrically connected to the connection section may be provided in the pixel chip. In this case, the columnar electric conductor is preferably arranged in a circumferential edge of the driver IC, and preferably extends in direction intersecting with the first surface.

In the pixel chip, the display panel, the lighting panel, the display unit, and the lighting unit according to the embodiments of the present technology, occurrence of false operation of the driver IC caused by light emitted from the light emitting device is allowed to be decreased. Therefore, false lighting of the light emitting device caused by false operation of the driver IC is able to be prevented.

Further, in the embodiments of the present technology, in the case where the columnar electric conductor is provided in the circumferential edge of the driver IC, light emitted from the light emitting device is allowed to be reflected by the columnar electric conductor. Thereby, the light emitted from the light emitting device is allowed to be prevented from entering the driver IC. Accordingly, false lighting of the light emitting device caused by false operation of the driver IC is allowed to be prevented.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the technology.

FIGS. 7A to 7C are cross-sectional views for explaining steps following the steps of FIGS. 6A to 6C.

FIGS. 8A and 8B are cross-sectional views for explaining steps following the steps of FIGS. 7A to 7C.

FIGS. 11A and 11B are cross-sectional views for explaining steps following the steps of FIGS. 10A and 10B.

FIGS. 16A and 16B are cross-sectional views for explaining steps following the steps of FIGS. 15A to 15C.

FIGS. 18A and 18B are cross-sectional views for explaining steps following the steps of FIGS. 17A and 17B.

FIGS. 19A and 19B are cross-sectional views for explaining steps following the steps of FIGS. 18A and 18B.

FIGS. 21A and 21B are cross-sectional views for explaining steps following the steps of FIGS. 20A and 20B.

DETAILED DESCRIPTION OF THE PREFERRED EMBODIMENTS

Embodiments of the present disclosure will be hereinafter described in detail with reference to the drawings. The description will be given in the following order:
1. First embodiment (pixel chip)
2. Modifications (pixel chip)
3. Second embodiment (display unit)
4. Third embodiment (lighting unit)
[1. First Embodiment]
[Configuration]

Figure 1A:
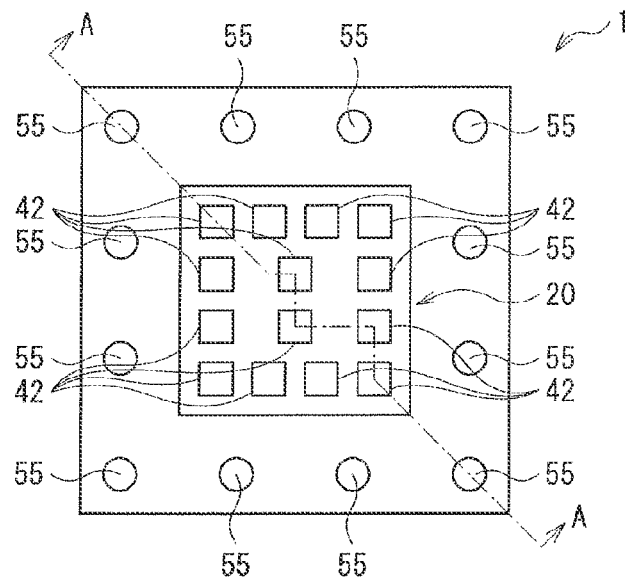
FIGS. 1A and 1B are a top view and a cross-sectional view illustrating a configuration example of a pixel chip according to a first embodiment of the present technology, respectively.
Figure 1B:
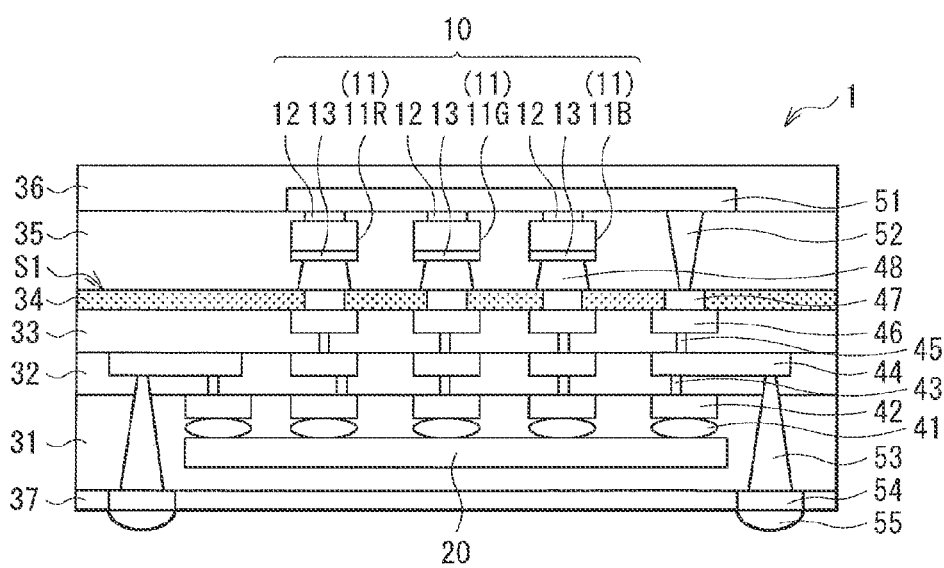

First, a description will be given of a pixel chip 1 according to the first embodiment of the present technology. FIG. 1A illustrates an example of a top surface configuration of the pixel chip 1. FIG. 1B illustrates an example of a cross-sectional configuration taken along line A-A of FIG. 1A. The pixel chip 1 is suitably applicable as a display pixel of a display unit that is what we call an LED display.

For example, as illustrated in FIGS. 1A and 1B, the pixel chip 1 includes a chip-like light emitting device 10. The pixel chip 1 further includes a chip-like driver IC 20 that drives the light emitting device 10. The light emitting device 10 configures one channel (one pixel). Therefore, the pixel chip 1 is of a single channel type. The light emitting device 10 has, for example, as illustrated in FIG. 1B, three types of light emitting devices 11R, 11G, and 11B. In the following description, a light emitting device 11 is used as a generic term of the light emitting devices 11R, 11G, and 11B.

The number of types of the light emitting devices 11 included in the light emitting device 10 is not limited to three, and may be one, two, or four or more. Further, the number of the light emitting devices 11 included in the light emitting device 10 is not limited to three, and may be one, two, or four or more.

In the case where a plurality of light emitting devices 11 are included in the light emitting device 10, the respective light emitting devices 11 are mounted on a common surface (mounting surface S1). The respective light emitting devices 11 are arranged in the pixel chip 1, and are, for example, arranged with a given space between each other. The respective light emitting devices 11 included in the light emitting device 10 are arranged above the driver IC 20. The respective light emitting devices 11 included in the light emitting device 10 are preferably arranged in a region opposed to the top surface of the driver IC 20, from a view point of allowing a wiring which electrically connects the respective light emitting devices 11 to the driver IC 20 to be shortened as much as possible.

The light emitting device 11R emits light in the red band, the light emitting device 11G emits light in the green band, and the light emitting device 11B emits light in the blue band. The light emitting device 11 is a solid light emitting device that emits light in a given waveband from the top surface, and is specifically an LED chip. Therefore, the surface above the light emitting device 11, that is, the top surface of the pixel chip 1 is a light output surface.

In this case, the LED chip means a chip in a state of being carved out from a wafer used for crystal growth, and does not mean a package type covered with a molded resin or the like. The LED chip is, for example, from 5 µm to 100 mm both inclusive long, and is what we call a micro LED. The planar shape of the LED chip is, for example, an approximate square. The LED chip is in a state of flake. The aspect ratio (height/width) of the LED chip is, for example, equal to or larger than 0.1 and smaller than 1.

For example, though not illustrated, the respective light emitting devices 11 have a semiconductor layer in which a first conductive type layer, an active layer, and a second conductive type layer are sequentially layered. In the light emitting devices 11G and 11B, the first conductive type layer, the active layer, and the second conductive type layer are, for example, made of an InGaN semiconductor material. Meanwhile, in the light emitting device 11R, the first conductive type layer, the active layer, and the second conductive type layer are, for example, made of an AlGaInP semiconductor material.

The respective light emitting devices 11 have a first electrode 12 (see FIG. 1B) on the top surface of the second conductive type layer. The first electrode 12 is contacted with the second conductive type layer, and is electrically connected to the second conductive type layer. The respective light emitting devices 11 have a second electrode 13 (see FIG. 1B) on the bottom surface of the first conductive type layer. The second electrode 13 is contacted with the first conductive type layer, and is electrically connected to the first conductive type layer. Each of the first electrode 12 and the second electrode 13 may be composed of a single electrode, or may be composed of a plurality of electrodes. The first electrode 12 and the second electrode 13 include a high reflective metal material such as Ag (silver). Though not illustrated, the respective light emitting devices 11 may have a thin insulating film that covers side faces thereof, a region where the first electrode 12 is not formed out of the top surface thereof, and a region where the second electrode 13 is not formed out of the bottom surface thereof.

The pixel chip 1 further includes wirings (connection section) that electrically connect the electrodes (the first electrode 12 and the second electrode 13) of the respective light emitting devices 11 to the driver IC 20. As illustrated in FIG. 1B, the wirings penetrate through many insulating layers (insulating layers 31 to 35, and 37) formed in the pixel chip 1. For example, as illustrated in FIG. 1B, the second electrode 13 of the respective light emitting devices 11 is electrically connected to the driver IC 20 through a solder layer 48, a wiring layer 47, a wiring layer 46, a via 45, a wiring layer 44, a via 43, a wiring layer 42, and a solder layer 41. Meanwhile, for example, as illustrated in FIG. 1B, the first electrode 12 of the respective light emitting devices 11 is electrically connected to the driver IC 20 through a wiring layer 51, a via 52, the wiring layer 47, the wiring layer 46, the via 45, the wiring layer 44, the via 43, the wiring layer 42, and the solder layer 41.

The wiring layers 42, 44, 46, 47, and 51 are conductive wirings patterned in a given plane, and are made of, for example, a metal material such as copper. The wiring layer 51 may be made of a transparent conductive material (for example, ITO). The vias 43, 45, and 52 electrically connect the wiring layers 42, 44, 46, 47, and 51 formed in the pixel chip 1 to one another in the lamination direction, and are columnar conductive materials extending in a direction intersecting with the mounting surface S1. The vias 43, 45, and 52 are made of, for example, a metal material such as copper. The solder layer 41 is intended to electrically connect the driver IC 20 to the wiring layer 42 in mounting the driver IC 20 on the wiring layer 42 in the course of manufacture. The solder layer 41 is made of, for example, a metal material such as tin. The insulating layers 31 to 37 are made of an insulating material such as a resin. The insulating layers 31 to 33 and 35 to 37 are made of, for example, a material having optical transparency. The insulating layer 34 includes a material having light shielding effect, and is made of, for example, a resin added with a light-absorbing material.

For example, as illustrated in FIG. 1B, the pixel chip 1 includes a plurality of pad electrodes 54 for inputting electric power and a control signal to the light emitting device 10 and the driver IC 20 on the bottom surface of the pixel chip 1. In other words, the bottom surface of the pixel chip 1 is an input/output terminal surface of the pixel chip 1. For example, as illustrated in FIGS. 1A and 1B, the plurality of pad electrodes 54 are arranged in a region not opposed to the driver IC 20 (specifically, outer edge out of the bottom surface of the pixel chip 1). For example, as illustrated in FIG. 1B, the pixel chip 1 includes a solder ball 55 on the surface of the respective pad electrodes 54 (surface exposed at the bottom surface of the pixel chip 1). A via 53 is respectively contacted with the opposite surface of the surface exposed at the bottom surface of the pixel chip 1 out of the surfaces of the respective pad electrodes 54. Therefore, the respective vias 53 are arranged in the circumferential edge of the driver IC 20.

For example, as illustrated in FIG. 1B, the driver IC 20 is arranged in a region opposed to the light emitting device 10. The driver IC 20 is, for example, electrically connected to the pad electrode 54 through the solder layer 41, the wiring layer 42, the via 43, the wiring layer 44, and the via 53. Further, for example, as illustrated in FIG. 1B, the first electrode 12 of the respective light emitting devices 11 is electrically connected to the pad electrode 54 through the wiring layer 51, the via 52, the wiring layer 47, the wiring layer 46, the via 45, the wiring layer 44, and the via 53. The pad electrode 54 and the solder ball 55 are made of, for example, a metal material.

In this embodiment, the top surface of the foregoing insulating layer 34 is the mounting surface S1 of the respective light emitting devices 11. The respective light emitting devices 11 are mounted on the mounting surface S1 with the solder layer 48 in between, for example. The insulating layer 34 has an aperture directly under the respective light emitting devices 11 (or the respective solder layers 48). In the aperture, the wiring layer 47 is provided. The solder layer 48 may cover the entire top surface of the wiring layer 47, or may cover only part of the top surface of the wiring layer 47. The wiring layer 47 is filled in at least the aperture of the insulating layer 34, and in some cases, may run over the aperture of the insulating layer 34.

Further, in this embodiment, the driver IC 20 is arranged in a region opposed to the mounting surface S1 of the respective light emitting devices 11 that is below the mounting surface S1 (that is, below the respective light emitting devices 11). The wirings that electrically connect the respective light emitting devices 11 to the driver IC 20 are arranged between the respective light emitting devices 11 and the driver IC 20, and the solder layer 48 and the wiring layer 47 as part of the wirings cover the aperture of the insulating layer 34.

Further, in this embodiment, the insulating layer 34 has a function to block direct entrance of light emitted from the respective light emitting devices 11 into the driver IC 20 together with the wiring layer 47 and the solder layer 48. For example, in the case where the pixel chip 1 is viewed from the top surface, for example, as illustrated in FIG. 1B, the insulating layer 34 is formed entirely in the pixel chip 1, and the wiring layer 47 and the solder layer 48 totally covers the aperture of the insulating layer 34. In the case where the insulating layer 34, the wiring layer 47, and the solder layer 48 are configured as exemplified above, there is no path through which light emitted from the respective light emitting devices 11 is propagated to layers below the surface S1 in the pixel chip 1. If the purpose is only to block direct entrance of the light emitted from the respective light emitting devices 11 into the driver IC 20, the insulating layer 34 is not necessarily formed entirely in the pixel chip 1, and the section not opposed to the driver IC 20 out of the insulating layer 34 may have optical transparency.

[Manufacturing Method]

Next, a description will be given of an example of methods of manufacturing the pixel chip 1.

Figure 2A:
FIGS. 2A to 2D are cross-sectional views for explaining an example of manufacturing steps of the pixel chip of FIGS. 1A and 1B.
Figure 2B:
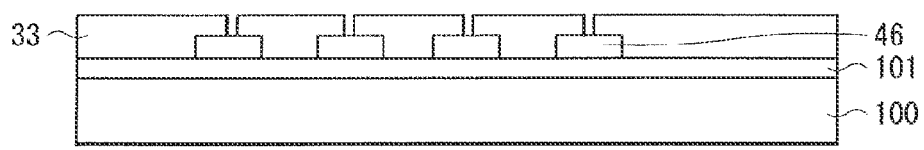
Figure 2C:
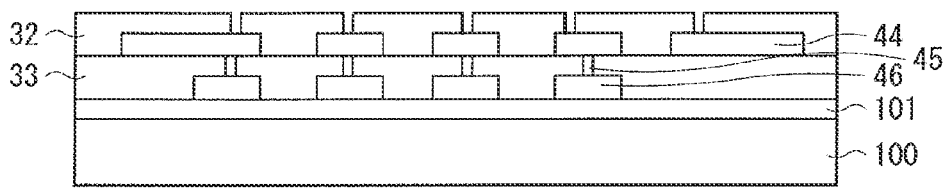
Figure 2D:
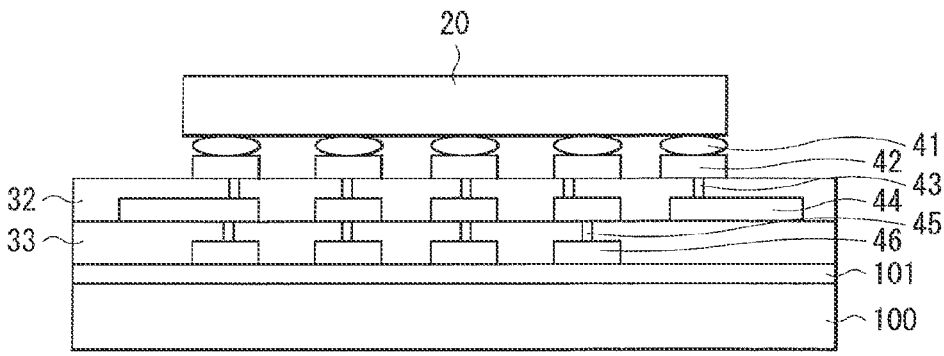

FIG. 2A to FIG. 11B illustrate the example of methods of manufacturing the pixel chip 1. First, a support substrate 100 having an exfoliation layer 101 on the surface thereof is prepared (FIG. 2A). Next, the wiring layer 46 and the insulating layer 33 are formed on the surface of the exfoliation layer 101 (FIG. 2B). At this time, an aperture is formed in a region directly above the wiring layer 46 out of the insulating layer 33. Next, the via 45 is formed in the aperture of the insulating layer 33, and the wiring layer 44 and the insulating layer 32 are formed on the surface of the insulating layer 33 (FIG. 2C). At this time, an aperture is formed in a region directly above the wiring layer 44 out of the insulating layer 32. Next, the via 43 is formed in the aperture of the insulating layer 32, and the wiring layer 42 is formed on the surface of the insulating layer 32 (FIG. 2D). Further, the driver IC 20 is arranged over the surface of the wiring layer 42 with the solder layer 41 in between.

Figure 3A:
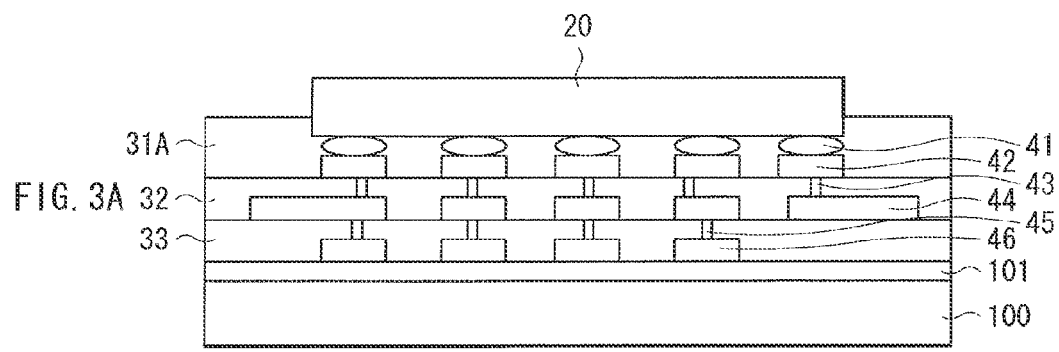
FIGS. 3A to 3C are cross-sectional views for explaining steps following the steps of FIGS. 2A to 2D.
Figure 3B:
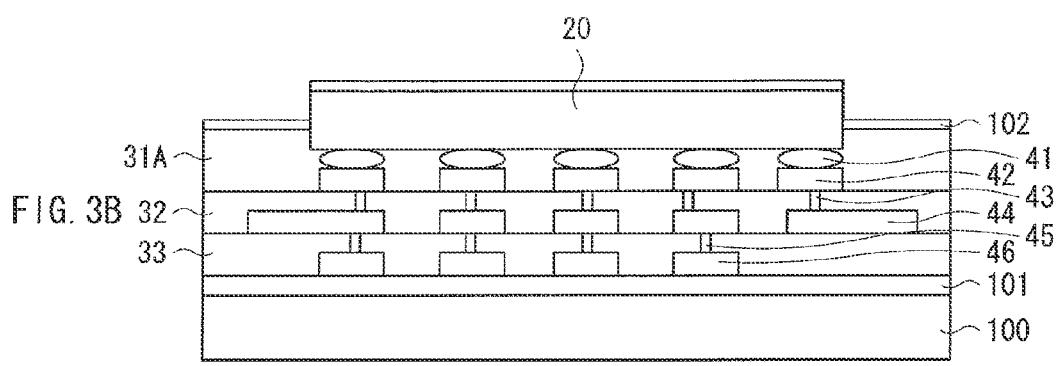
Figure 3C:
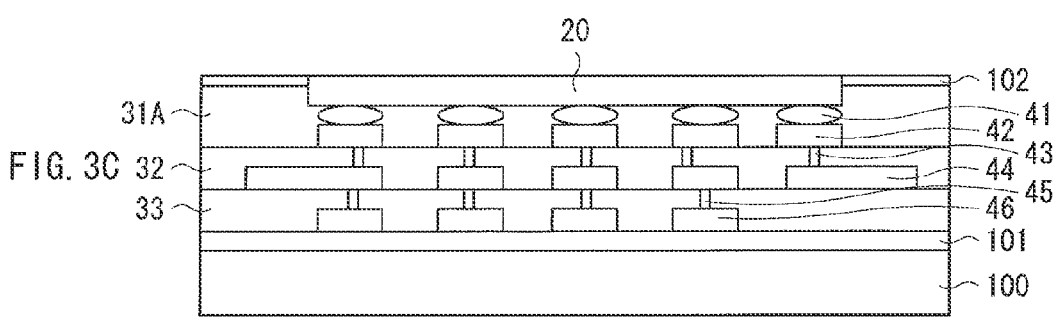

Next, an insulating layer 31A having a thickness with which part of side faces of the driver IC 20 is buried therein is formed (FIG. 3A). Next, an etching stop layer 102 made of copper or the like is formed on the entire surface of the driver IC 20 by, for example, sputtering (FIG. 3B). Subsequently, the driver IC 20 is polished until a given thickness of the driver IC 20 is obtained by, for example, lapping (FIG. 3C). For example, as illustrated in FIG. 3C, the driver IC 20 is polished until the top surface of the driver IC 20 becomes in the same plane as the top surface of the etching stop layer 102 formed around the driver IC 20.

Figure 4A:
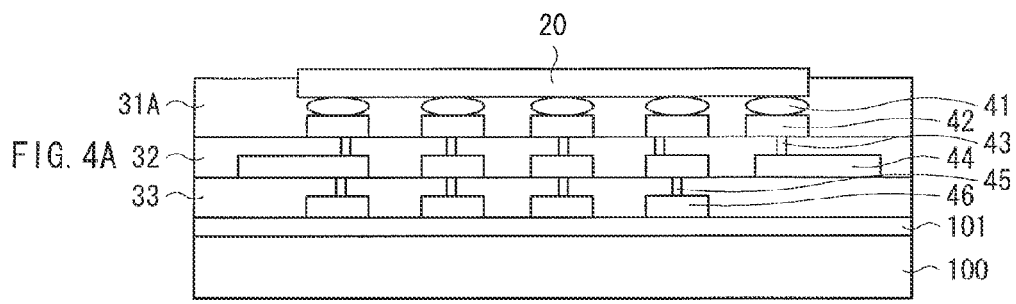
FIGS. 4A to 4C are cross-sectional views for explaining steps following the steps of FIGS. 3A to 3C.
Figure 4B:
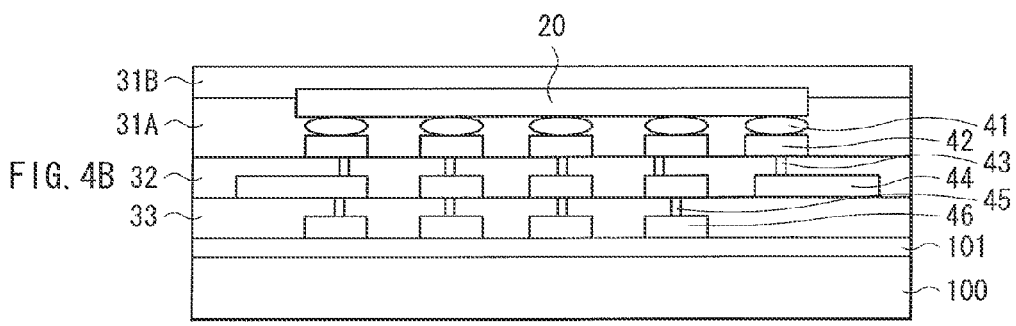
Figure 4C:
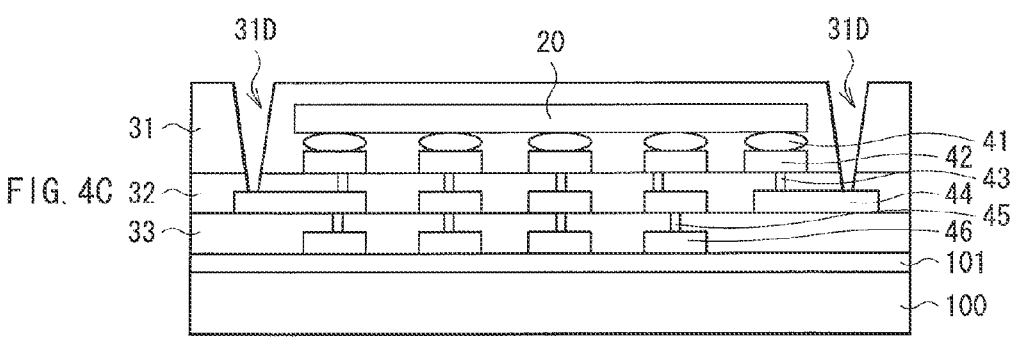

After that, the etching stop layer 102 is removed (FIG. 4A), and an insulating layer 31B having a thickness with which the entire driver IC 20 is buried therein is formed (FIG. 4B). The insulating layers 31A and 31B correspond to the foregoing insulating layer 31. Next, a via hole 31D penetrating the insulating layers 31 and 32 is formed by, for example, laser processing (FIG. 4C).

Figure 5A:
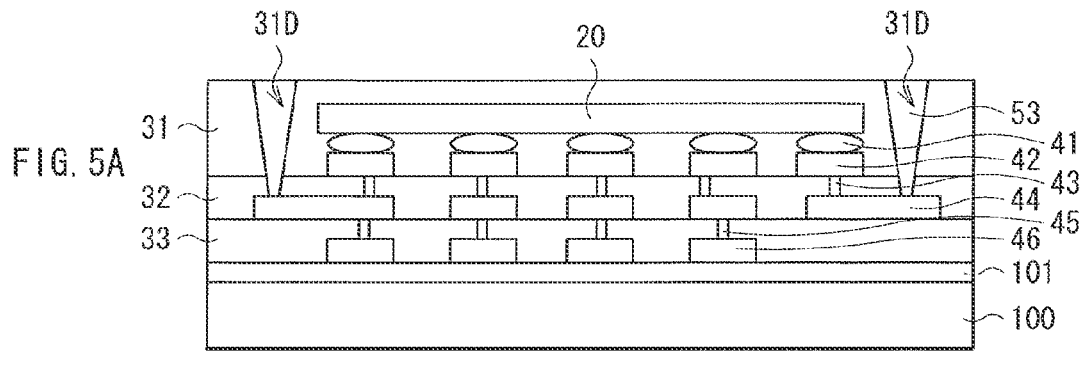
FIGS. 5A to 5C are cross-sectional views for explaining steps following the steps of FIGS. 4A to 4C.
Figure 5B:
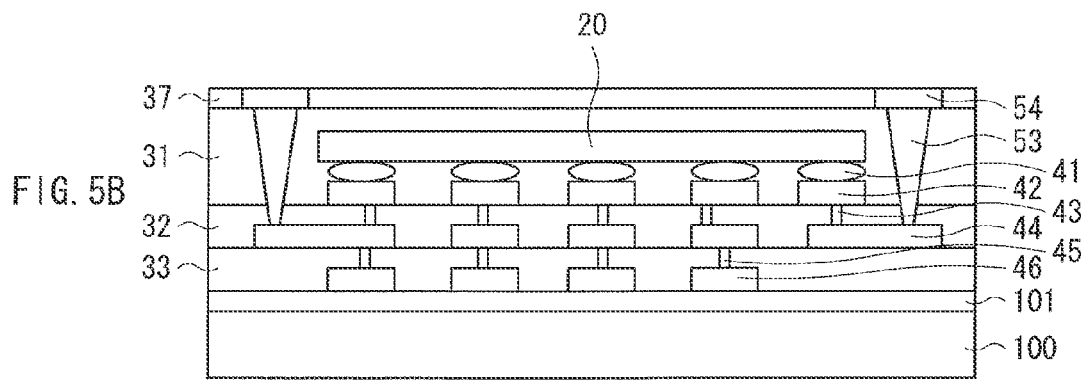
Figure 5C:
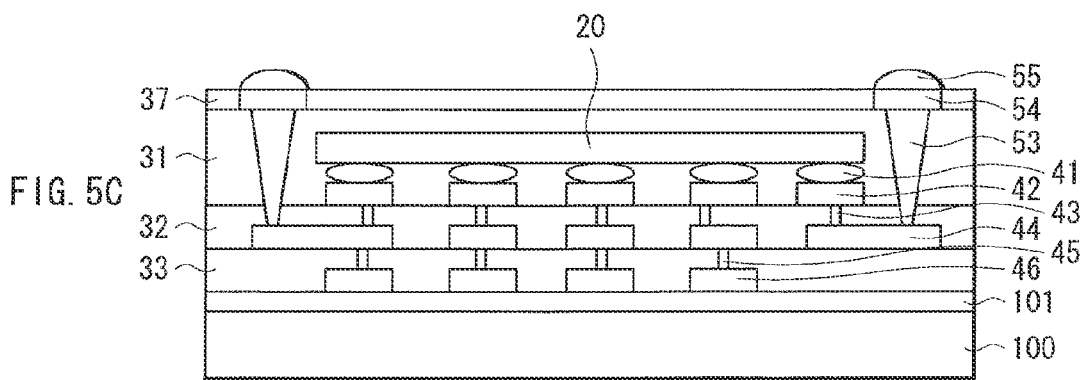

Next, for example, the via 53 is formed in the via hole 31D by, for example, copper electrolytic plating (FIG. 5A). Next, after an insulating layer 37 having an aperture on the via 53 is formed, the pad electrode 54 is formed by, for example, nickel electrolytic plating (FIG. 5B). Further, for example, tin electrolytic plating and reflow are performed, and thereby the solder ball 55 is formed on the pad electrode 54 (FIG. 5C).

Figure 6A:
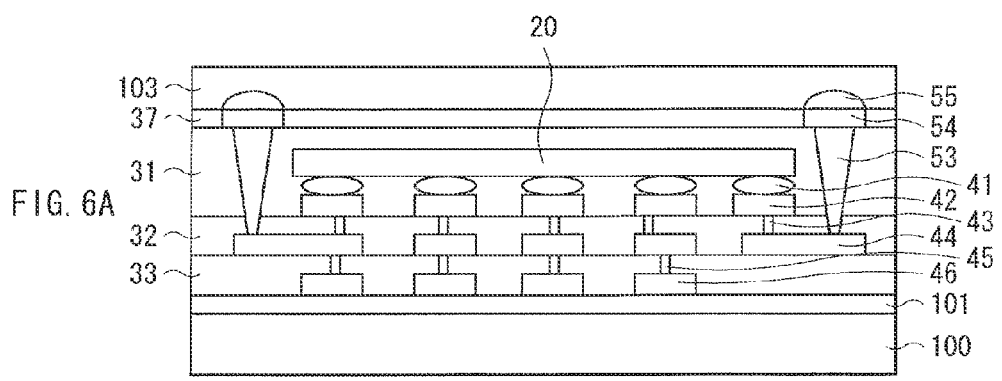
FIGS. 6A to 6C are cross-sectional views for explaining steps following the steps of FIGS. 5A to 5C.
Figure 6B:
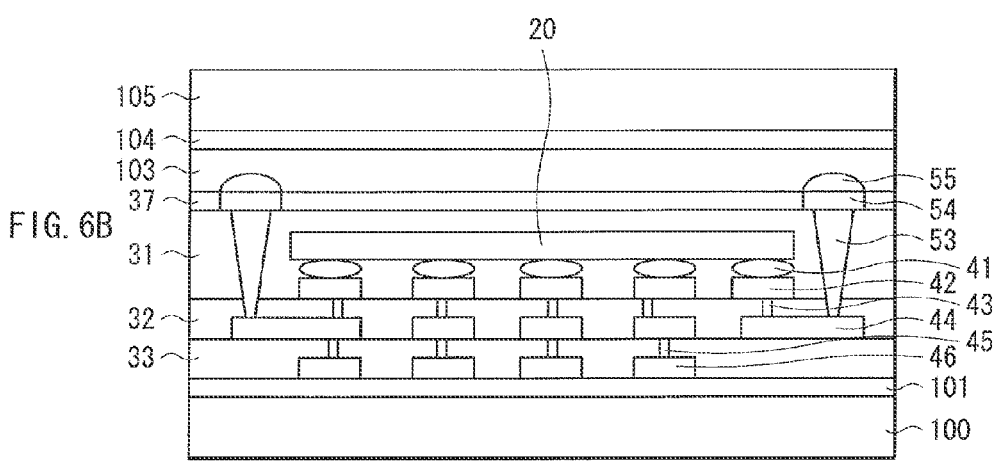
Figure 6C:
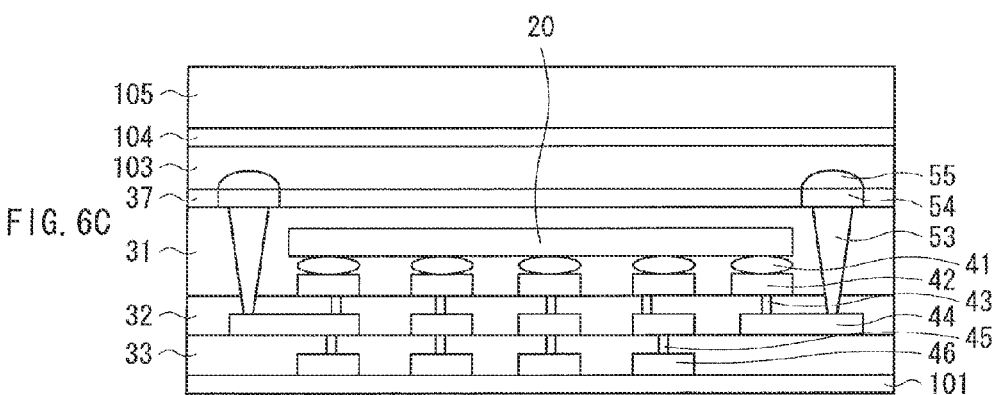

Next, after an insulating layer 103 into which the solder ball 55 is buried is formed (FIG. 6A), a support substrate 105 is bonded with the insulating layer 103 with an exfoliation layer 104 in between (FIG. 6B). After that, the support substrate 100 is exfoliated (FIG. 6C), and the exfoliation layer 101 is removed (FIG. 7A). Next, the insulating layer 34 having light shielding effect is formed on the surface on the side from which the exfoliation layer 101 is removed, and an aperture of the insulating layer 34 is filled with the wiring layer 47 (FIG. 7B). Further, a solder layer 48A is formed only in sections on which the light emitting devices 11 are to be subsequently mounted out of the surface of the wiring layer 47 (FIG. 7C).

Next, the light emitting devices 11R, 11G, and 11B are transcribed on the solder layer 48A (FIG. 8A). At this time, in some cases, the light emitting devices 11R, 11G, and 11B are transcribed on the solder layer 48A being slightly shifted from a given position. However, the light emitting devices 11R, 11G, and 11B are allowed to be moved to the given position by performing reflow or the like (FIG. 8B).

Figure 9A:
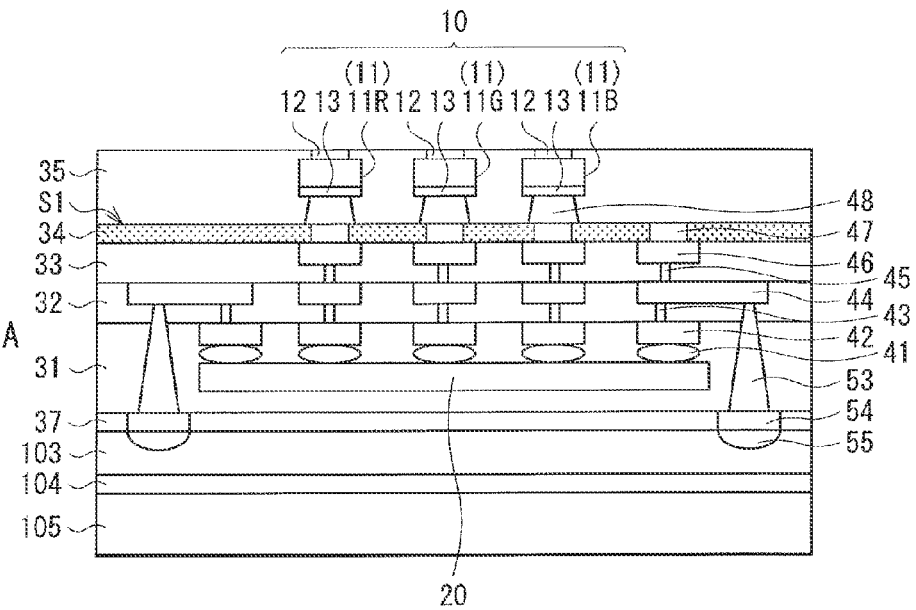
FIGS. 9A and 9B are cross-sectional views for explaining steps following the steps of FIGS. 8A and 8B.
Figure 9B:
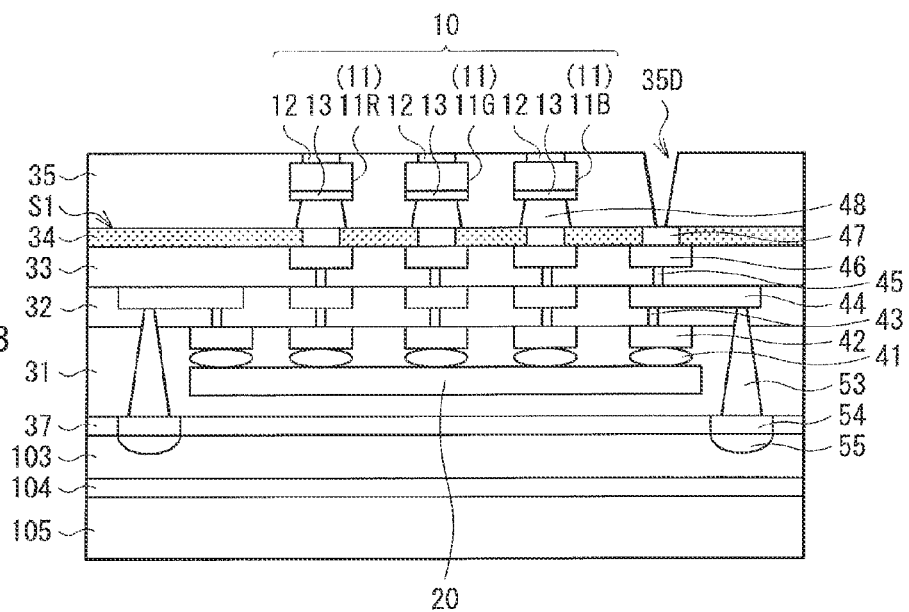
Figure 10A:
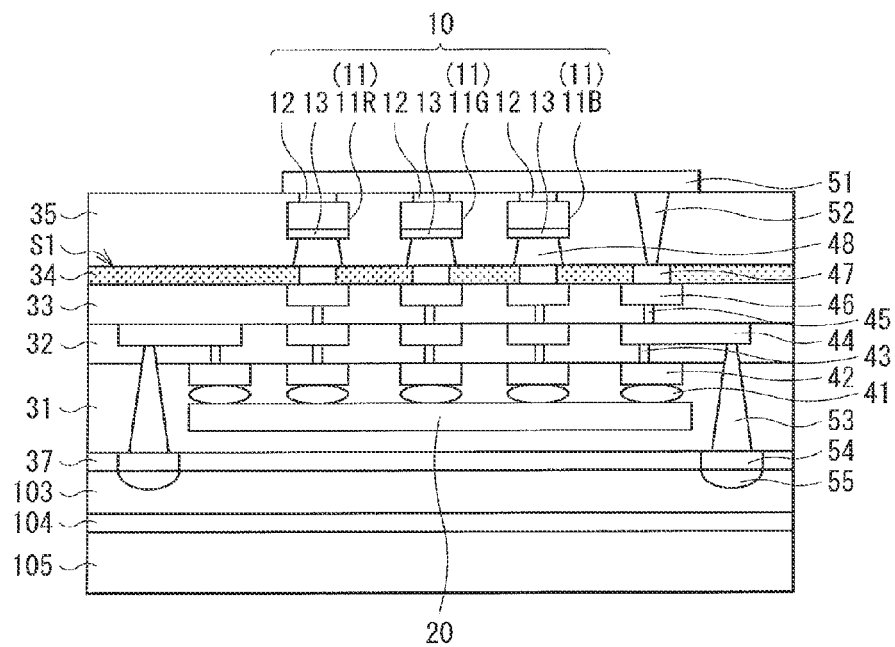
FIGS. 10A and 10B are cross-sectional views for explaining steps following the steps of FIGS. 9A and 9B.
Figure 10B:
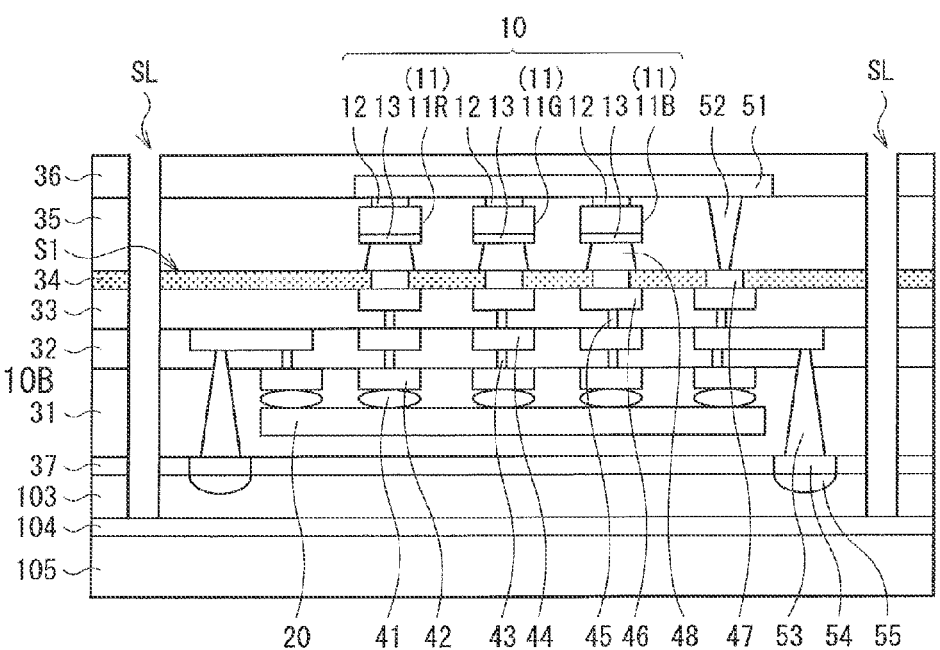

Next, after the insulating layer 35 into which the respective light emitting devices 11 are buried is formed in a state that the top surface (first electrode 12) of the respective light emitting devices 11 is exposed (FIG. 9A), a via hole 35D is formed in the insulating layer 35 by, for example, laser processing (FIG. 9B). Next, the via 52 is formed in the via hole 35D by, for example, titanium/copper sputtering, and the wiring layer 51 that connects the via 52 to the first electrode 12 of the respective light emitting devices 11 is formed (FIG. 10A). Next, after the insulating layer 36 into which the wiring layer 51 is buried is formed, a slit SL that reaches the exfoliation layer 104 is formed in a given position (FIG. 10B). Thereby, resin separation is made for the respective light emitting devices 10, and the pixel chip 1 is formed.

Next, after a support substrate 107 is bonded with the surface on the insulating layer 36 side with an exfoliation layer 106 in between, the support substrate 105 and the exfoliation layer 104 are removed (FIG. 11A). Further, the insulating layer 103 is also removed, and the solder ball 55 is exposed (FIG. 11B). Thereby, the chip-like pixel chip 1 provided with resin separation is allowed to be transcribed on a given position of a circuit substrate or the like. Accordingly, the pixel chip 1 is manufactured.

[Effect]

Next, a description will be given of effect of the pixel chip 1 according to this embodiment. In this embodiment, the insulating layer 34, the wiring layer 46, and the solder layer 48 having a function to block direct entrance of light emitted from the light emitting device 10 into the driver IC 20 are provided between the light emitting device 10 and the driver IC 20. Thereby, occurrence of false operation of the driver IC 20 caused by the light emitted from the light emitting device 10 is allowed to be decreased, and false lighting of the light emitting device 10 caused by false operation of the driver IC 20 is allowed to be prevented.

Further, in this embodiment, the plurality of vias 53 are arranged in the circumferential edge of the driver IC 20. Thereby, even if light emitted from the light emitting device 10 is leaked to the driver IC 20 side, part of the leaked light is allowed to be reflected by the via 53. In other words, the via 53 also plays a role as a preventer of false lighting of the light emitting device 10 caused by false operation of the driver IC 20.

[2. Modifications]

[Modification 1]

Figure 12:
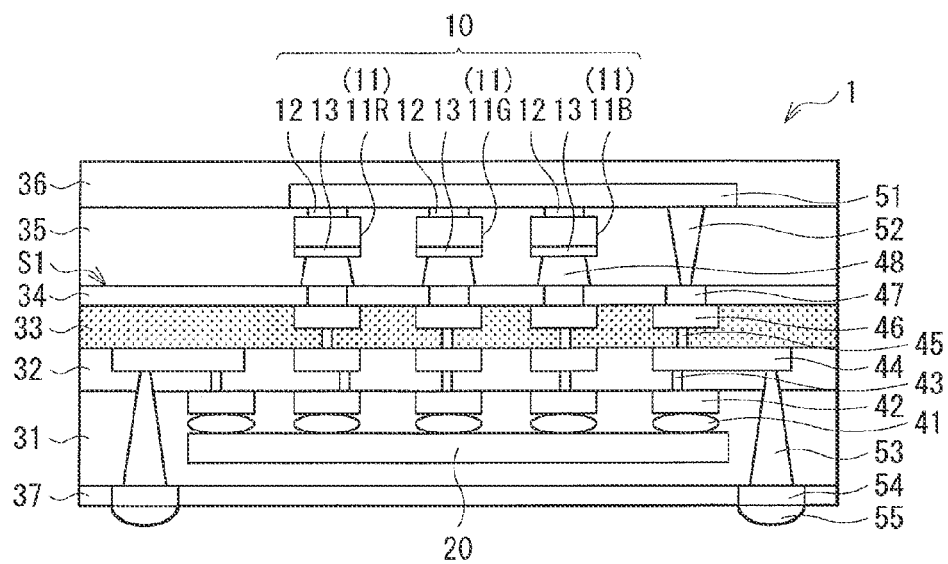
FIG. 12 is a cross-sectional view illustrating a modification of the configuration of the pixel chip of FIGS. 1A and 1B.
Figure 13:
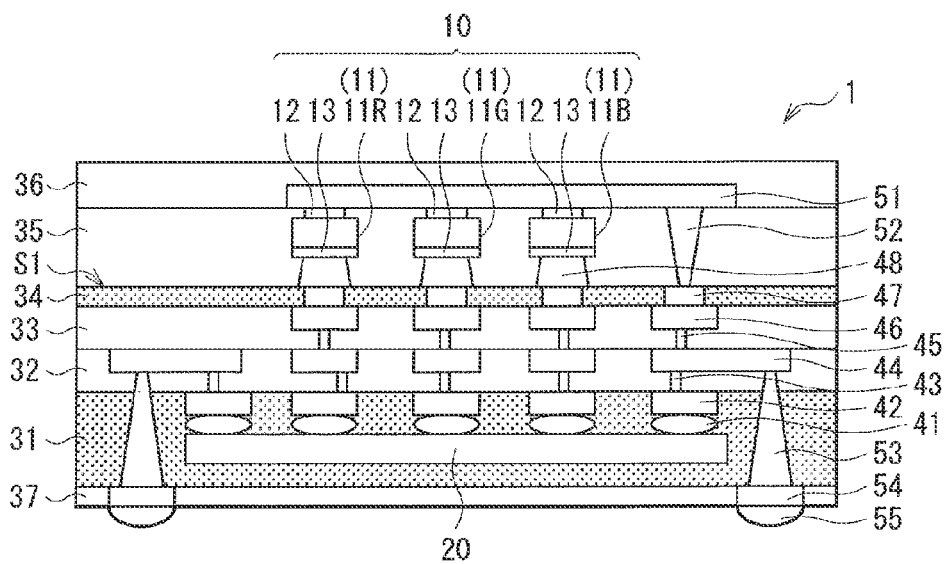
FIG. 13 is a cross-sectional view illustrating another modification of the configuration of the pixel chip of FIGS. 1A and 1B.

In the foregoing embodiment, the insulating layer 34 has light shielding function. However, other insulating layers 31 to 33 and 35 may have light shielding function. For example, as illustrated in FIG. 12, the insulating layer 33 may have light shielding function instead of the insulating layer 34. Otherwise, as illustrated in FIG. 13, the insulating layer 31 may have light shielding function as well in addition to the insulating layer 34. Otherwise, instead of the insulating layer 34 or in addition to the insulating layer 34, the insulating layer 35 may have light shielding function in a region that does not intercept light emission of the light emitting device 10.

[Modification 2]

Further, in the manufacturing method according to the foregoing embodiment, after the driver IC 20 is mounted, the light emitting device 10 is mounted. By contraries, it is possible that the light emitting device 10 is mounted and subsequently the driver IC 20 is mounted. A description will be hereinafter given of an example of manufacturing methods in the case that the light emitting device 10 is mounted and subsequently the driver IC 20 is mounted.

Figure 14A:
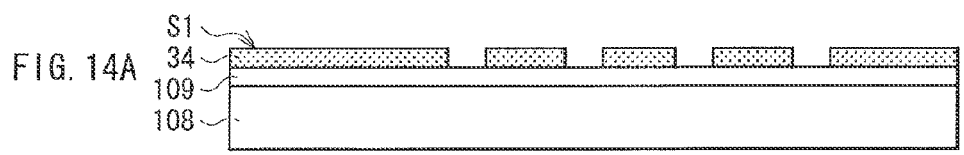
FIGS. 14A to 14D are cross-sectional views for explaining another example of manufacturing steps of the pixel chip of FIGS. 1A and 1B.
Figure 14B:
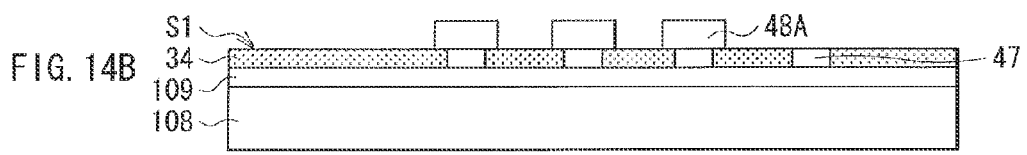

FIG. 14A to FIG. 22B illustrate another example of methods of manufacturing the pixel chip 1. First, after a support substrate 108 having an exfoliation layer 109 on the surface thereof is prepared, the insulating layer 34 having light shielding effect is formed on the surface of the exfoliation layer 109 (FIG. 14A). Next, an aperture of the insulating layer 34 is filled with the wiring layer 47, and the solder layer 48A is formed only in sections on which the light emitting devices 11 are to be subsequently mounted out of the surface of the wiring layer 47 (FIG. 14B).

Figure 14C:
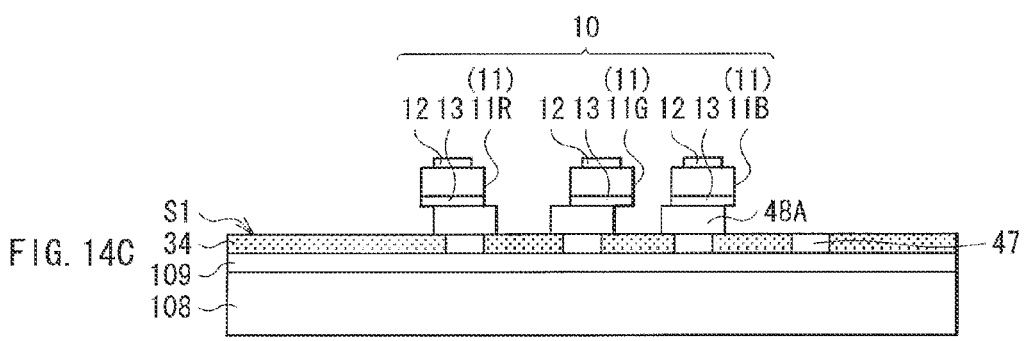
Figure 14D:
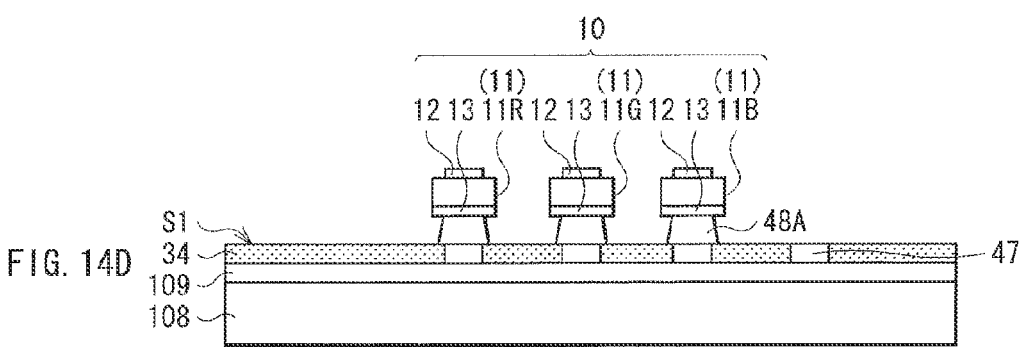

Next, the light emitting devices 11R, 11G, and 11B are transcribed on the solder layer 48A (FIG. 14C). At this time, in some cases, the light emitting devices 11R, 11G, and 11B are transcribed on the solder layer 48A being slightly shifted from a given position. However, the light emitting devices 11R, 11G, and 11B are allowed to be moved to the given position by performing reflow or the like (FIG. 14D).

Figure 15A:
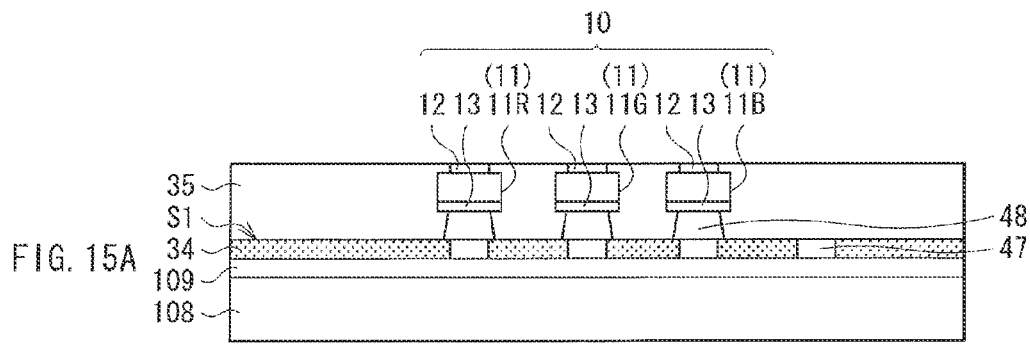
FIGS. 15A to 15C are cross-sectional views for explaining steps following the steps of FIGS. 14A to 14D.
Figure 15B:
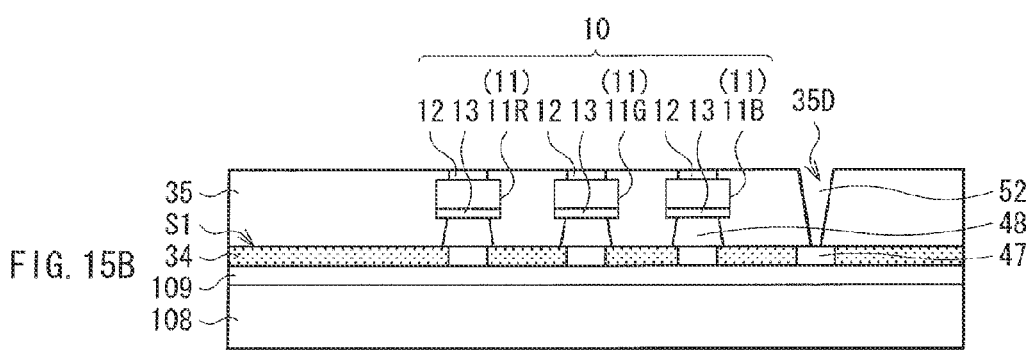
Figure 15C:
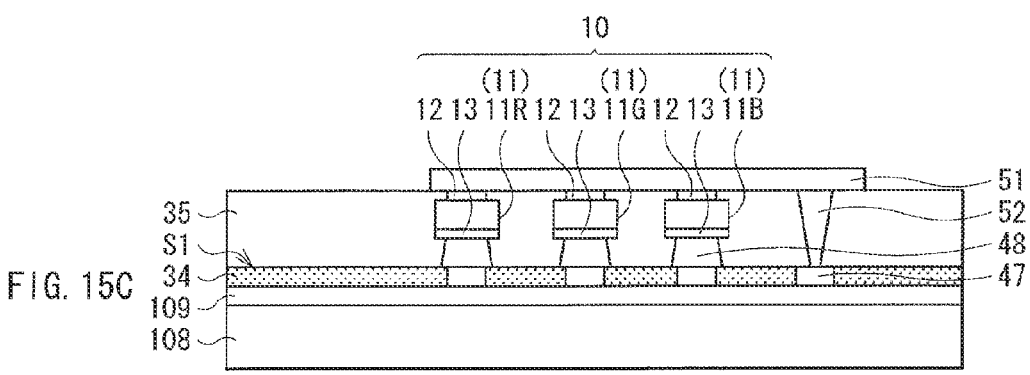

Next, after the insulating layer 35 into which the respective light emitting devices 11 are buried is formed in a state that the top surface (first electrode 12) of the respective light emitting devices 11 is exposed (FIG. 15A), the via hole 35D is formed in the insulating layer 35 by, for example, laser processing (FIG. 15B). Next, the via 52 is formed in the via hole 35D by, for example, titanium/copper sputtering, and the wiring layer 51 that connects the via 52 to the first electrode 12 of the respective light emitting devices 11 is formed (FIG. 15C).

Next, after the insulating layer 36 into which the wiring layer 51 is buried is formed, a support substrate 111 is bonded with the surface on the insulating layer 36 side with an exfoliation layer 110 in between (FIG. 16A). Subsequently, the support substrate 108 and the exfoliation layer 109 are removed (FIG. 16B).

Figure 17A:
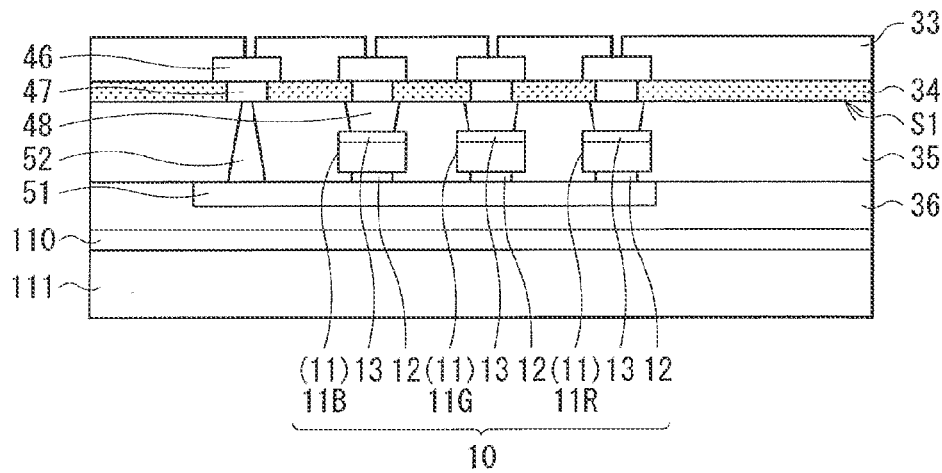
FIGS. 17A and 17B are cross-sectional views for explaining steps following the steps of FIGS. 16A and 16B.
Figure 17B:
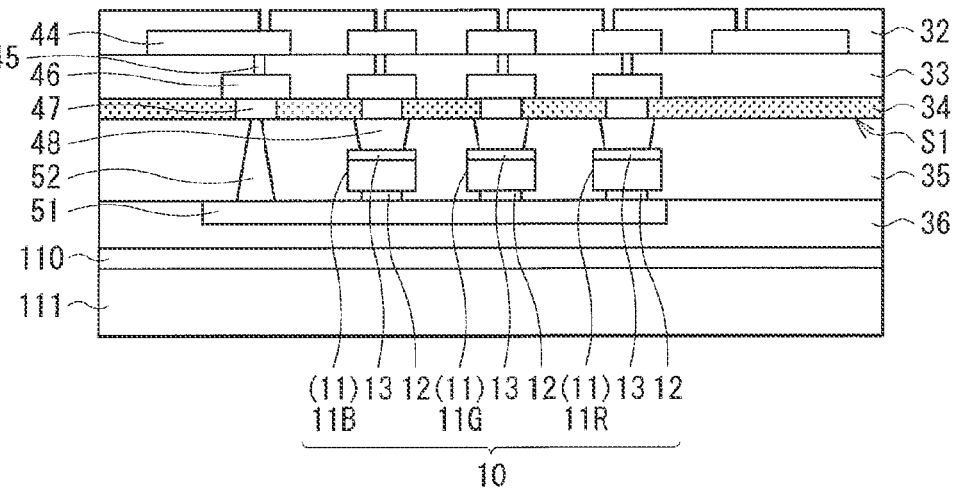

Next, the wiring layer 46 and the insulating layer 33 are formed on the surface of the insulating layer 34 (FIG. 17A). At this time, an aperture is formed in a region directly above the wiring layer 46 out of the insulating layer 33. Next, the via 45 is formed in the aperture of the insulating layer 33, and the wiring layer 44 and the insulating layer 32 are formed on the surface of the insulating layer 33 (FIG. 17B). At this time, an aperture is formed in a region directly above the wiring layer 44 out of the insulating layer 32.

Next, the via 43 is formed in the aperture of the insulating layer 32, the wiring layer 42 is formed on the surface of the insulating layer 32, and further, the driver IC 20 is arranged over the surface of the wiring layer 42 with the solder layer 41 in between (FIG. 18A). Next, the insulating layer 31A having a thickness with which part of side faces of the driver IC 20 is buried therein is formed (FIG. 18B).

Next, the etching stop layer 102 made of copper or the like is formed on the entire surface of the driver IC 20 by, for example, sputtering (FIG. 19A). Subsequently, the driver IC 20 is polished until a given thickness of the driver IC 20 is obtained by, for example, lapping (FIG. 19B). For example, as illustrated in FIG. 19B, the driver IC 20 is polished until the top surface of the driver IC 20 becomes in the same plane as the top surface of the etching stop layer 102 formed around the driver IC 20.

Figure 20A:
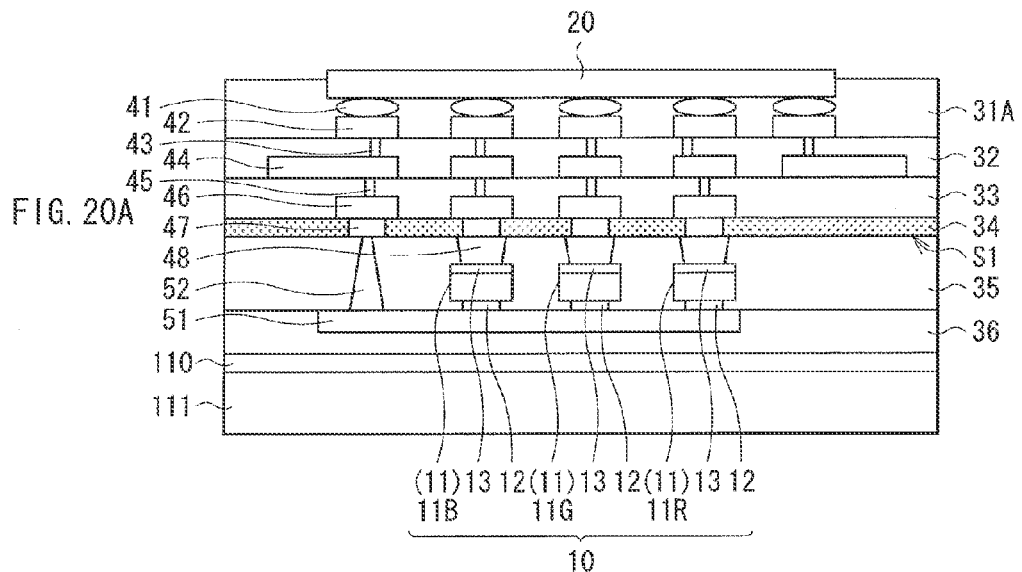
FIGS. 20A and 20B are cross-sectional views for explaining steps following the steps of FIGS. 19A and 19B.
Figure 20B:
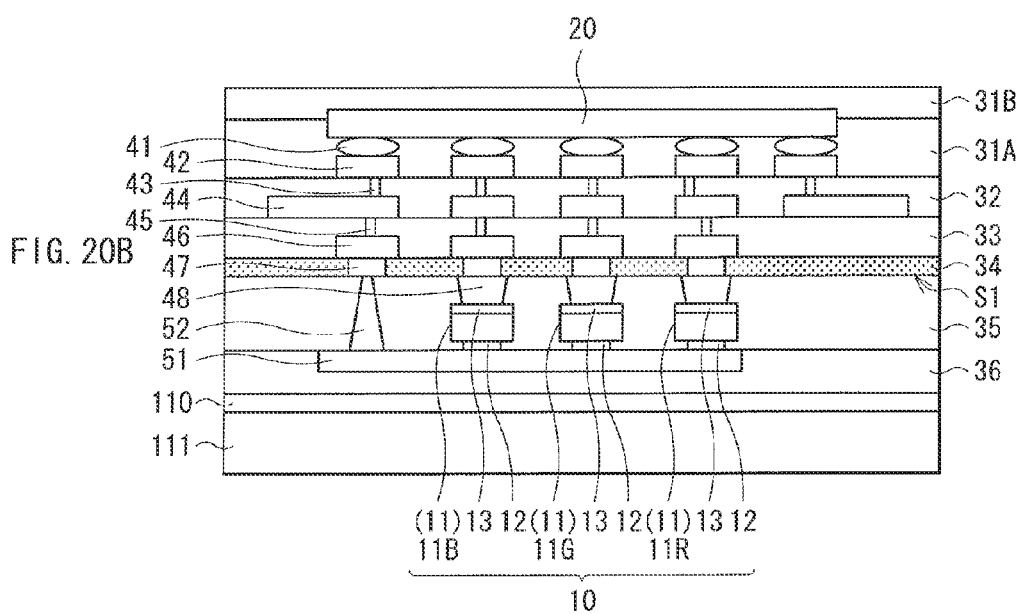

After that, the etching stop layer 102 is removed (FIG. 20A), and the insulating layer 31B having a thickness with which the entire driver IC 20 is buried therein is formed (FIG. 20B). The insulating layers 31A and 31B correspond to the foregoing insulating layer 31.

Next, after the via hole 31D penetrating the insulating layers 31 and 32 is formed by, for example, laser processing (FIG. 21A), the via 53 is formed in the via hole 31D by, for example, copper electrolytic plating (FIG. 21B).

Figure 22A:
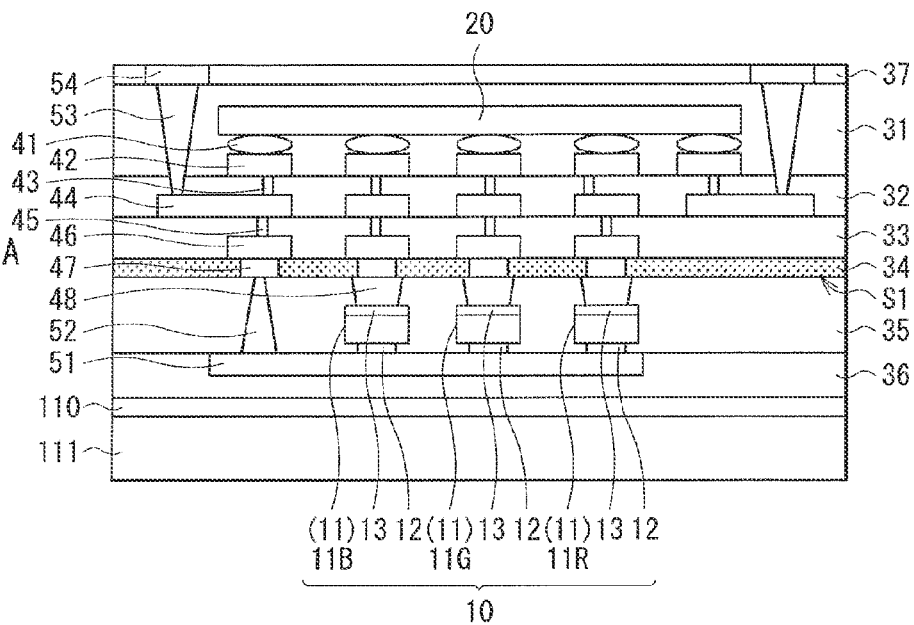
FIGS. 22A and 22B are cross-sectional views for explaining steps following the steps of FIGS. 21A and 21B.
Figure 22B:
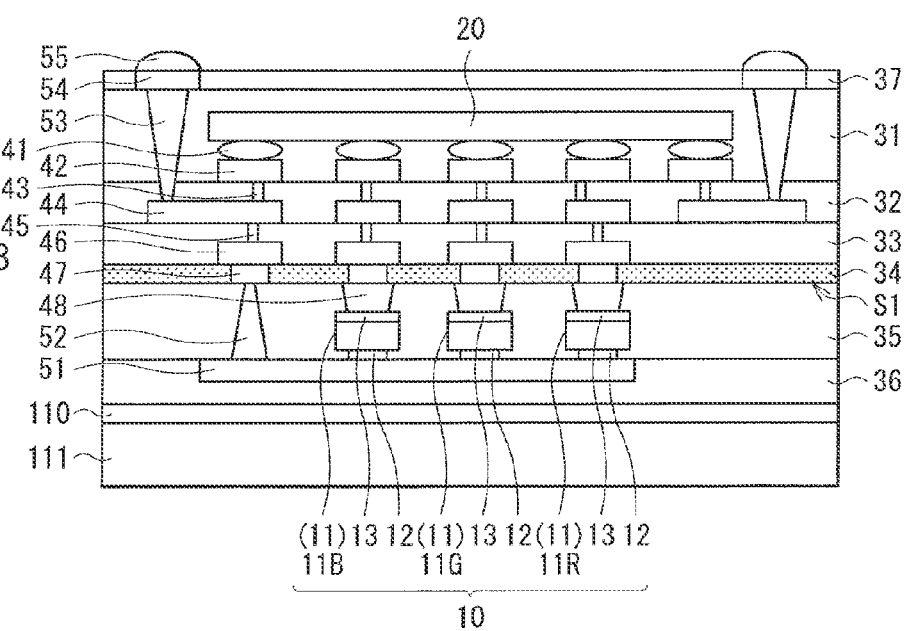

Next, after the insulating layer 37 having an aperture on the via 53 is formed, the pad electrode 54 is formed by, for example, nickel electrolytic plating (FIG. 22A). Further, for example, tin electrolytic plating and reflow are performed, and thereby the solder ball 55 is formed on the pad electrode 54 (FIG. 22B). After that, resin separation is made for the respective light emitting devices 10 by a method similar to the foregoing method. Accordingly, the pixel chip 1 is manufactured.

[Modification 3]

In the foregoing embodiment and the modifications thereof, the pixel chip 1 includes one light emitting device 10. However, the pixel chip 1 may include two or more light emitting devices 10. Hereinafter, a pixel chip including two or more light emitting devices 10 is referred to as a pixel chip 4 for convenience. In this example, since one light emitting device 10 configures one channel (one pixel), the pixel chip 4 is of a multichannel type (multiple pixels). The pixel chip 4 may include one driver IC 20 that drives all the light emitting devices 10 included in the pixel chip 4, or may include driver ICs 20 each driving one light emitting device 10. Herein, in the case where the pixel chip 4 includes one driver IC 20 that drives all the light emitting devices 10 included in the pixel chip 4, the respective light emitting devices 10 are preferably arranged in a region not opposed to the top surface of the driver IC 20 in the pixel chip 4, from a viewpoint of avoiding dense wirings in the pixel chip 4. Further, in the case where the driver IC 20 is disposed at the center of the pixel chip 4, the respective light emitting devices 10 are preferably arranged in a region not opposed to the top surface of the driver IC 20 in the pixel chip 4 as well as on the periphery of the pixel chip 4. On the other hand, in the case where the pixel chip 4 includes driver ICs 20 each driving one light emitting device 10, the respective light emitting devices 10 are preferably arranged in a region opposed to the top surface of the corresponding driver IC 20, from a viewpoint of avoiding dense wirings in the pixel chip 4.

Figure 23A:
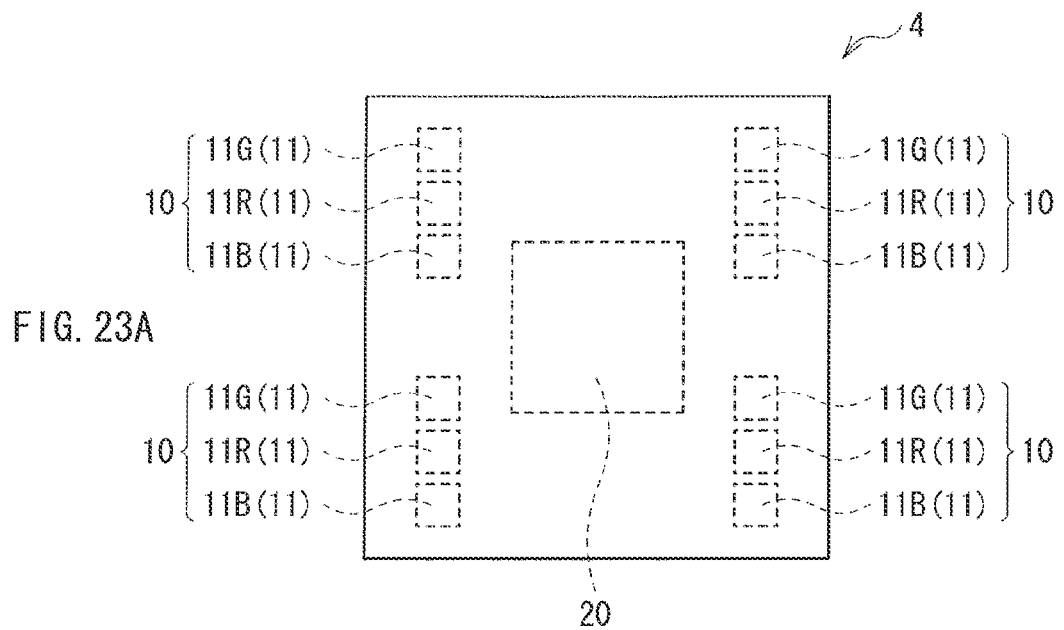
FIGS. 23A and 23B are a top view and a bottom view illustrating a modification of the configuration of the pixel chip of FIGS. 1A and 1B.
Figure 23B:
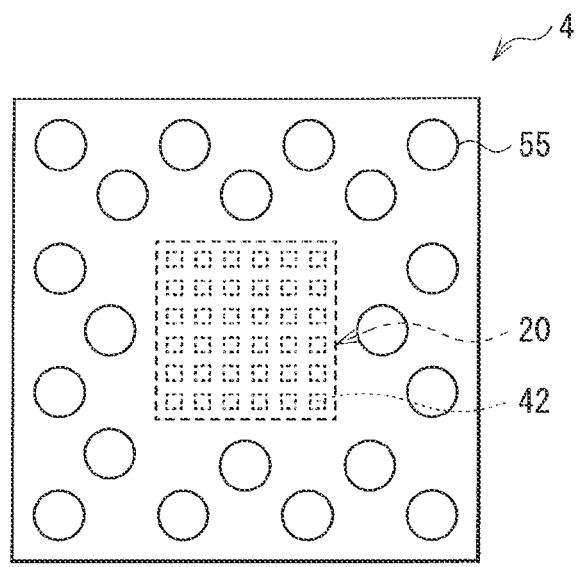

FIG. 23A illustrates an example of a top surface configuration of the pixel chip 4. FIG. 23B illustrates an example of a bottom surface configuration of the pixel chip 4. Note that since the light emitting devices 10 and the driver IC 20 are provided in the pixel chip 4, the light emitting devices 10 and the driver IC 20 are illustrated by broken lines in FIG. 23A. Similarly, since the driver ICs 20 and the wiring layer 42 are provided in the pixel chip 4A, the driver ICs 20 and the wiring layer 42 are illustrated by broken lines in FIG. 23B. As illustrated in FIG. 23A, for example, the pixel chip 4 includes four light emitting devices 10 and one driver IC 20 that drives the four light emitting devices 10. Each of the light emitting devices 10 includes, for example, three kinds of light emitting devices 11R, 11G, and 11B. For example, the respective light emitting devices 10 are disposed at four corners of the pixel chip 4, and the driver IC 20 is disposed at the center of the pixel chip 4 (namely, at a portion other than the portions just below the light emitting devices 10).

In the modification 3, the insulating layer 34, the wiring layer 46, and the solder layer 48 which have a function to block direct entrance of light emitted from each of the light emitting devices 10 into the driver IC 20 are provided between the four light emitting devices 10 and the driver IC 20. Thereby, occurrence of false operation of the driver IC 20 caused by the light emitted from each of the light emitting devices 10 is able to be decreased, and false lighting of the light emitting devices 10 caused by false operation of the driver IC 20 is able to be prevented.

[3. Second Embodiment]
[Configuration]

Figure 24:
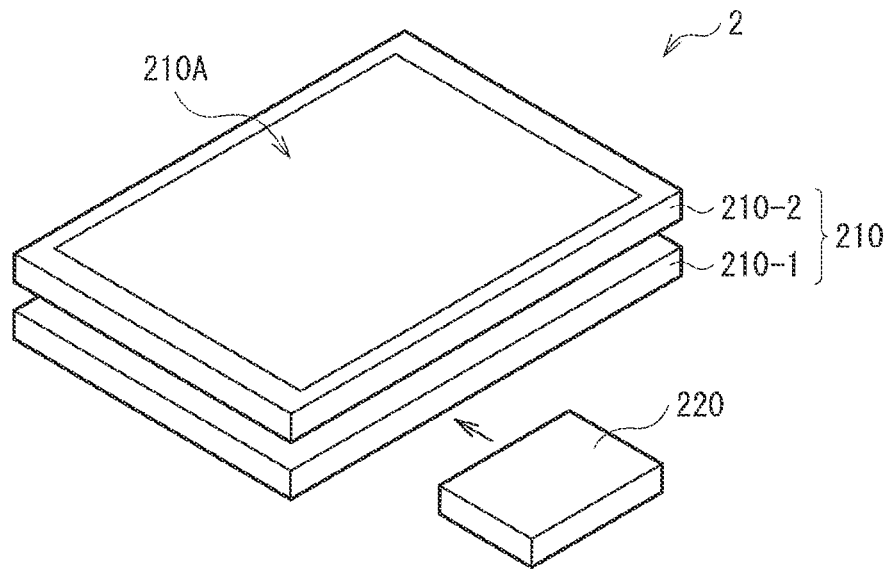
FIG. 24 is a perspective view illustrating a configuration example of a display unit according to a second embodiment of the present technology.

Next, a description will be given of a display unit 2 according to a second embodiment of the present technology. The display unit 2 includes the pixel chip 1 or 4 according to the foregoing embodiment and the modifications thereof as a display pixel. FIG. 24 is a perspective view of an example of a schematic configuration of the display unit 2. The display unit 2 is what we call an LED display, in which an LED is used as a display pixel. For example, as illustrated in FIG. 24, the display unit 2 includes a display panel 210 and a driver IC 220 that drives the display panel 210.

(Display Panel 210)

In the display panel 210, a mounting substrate 210-1 and a transparent substrate 210-2 are layered on each other. A surface of the transparent substrate 210-2 is a video display surface, including a display region 210A on the central section thereof and a frame region as a non-display region around the display region 210A.

(Mounting Substrate 210-1)

Figure 25:
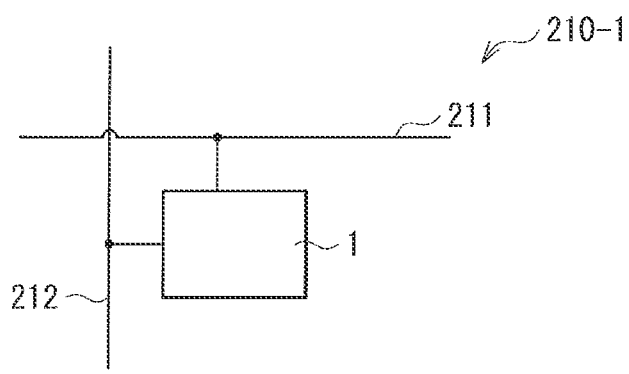
FIG. 25 is a plan view illustrating a layout example of a surface of a mounting substrate of FIG. 24.
Figure 26:
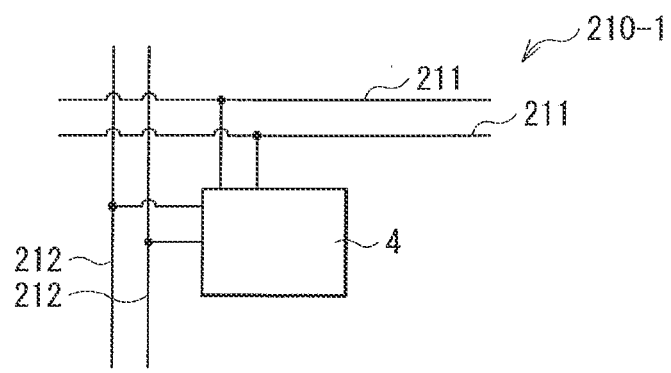
FIG. 26 is a plan view illustrating another layout example of the surface of the mounting substrate of FIG. 24

FIG. 25 illustrates a layout example of a region corresponding to the display region 210A out of the surface on the transparent substrate 210-2 side of the mounting substrate 210-1. For example, as illustrated in FIG. 25, the mounting substrate 210-1 has wirings 211 and 212 extending in a given direction in the region corresponding to the display region 210A. The wiring 211 includes a gate line and the like, and the wiring 212 includes a data line and the like. The wiring 211 intersects with the wiring 212, and the pixel chip 1 functioning as a display pixel is provided in a section where one wiring 211 intersects with one wiring 212. At this time, a plurality of pixel chips 1 is two-dimensionally arranged in a region corresponding to the display region 210A of the mounting substrate 210-1. The pixel chip 1 is electrically connected to the wirings 211 and 212. Note that in the case where the pixel chip 4 is used as the display pixel, the pixel chip 4 functioning as the display pixel is provided in a section where the plurality of wirings 211 intersect with the plurality of wirings 212. At this time, the plurality of pixel chips 4 is two-dimensionally arranged in a region corresponding to the display region 210A of the mounting substrate 210-1. Herein, in the case where the pixel chip 4 includes m×n pieces of light emitting devices 10 which are arranged in a matrix of m×n, the pixel chip 4 is provided in a section where m pieces of wirings 211 intersect with n pieces of wirings 212, and one wiring 211 is allocated to one row in the pixel chip 4 and one wiring 212 is allocated to one column in the pixel chip 4. Note that in FIG. 26, exemplified is the case where the pixel chip 4 includes four light emitting devices 10 arranged in a matrix of 2×2, and the pixel chip 4 is provided in a section where two wirings 211 intersect with two wirings 212.

(Transparent Substrate 210-2)

The transparent substrate 210-2 is composed of a glass substrate, a resin substrate, or the like. In the transparent substrate 210-2, a surface on the pixel chip 1 side may be flat, or may be a rough surface.

(Driver IC 220)

Figure 27:
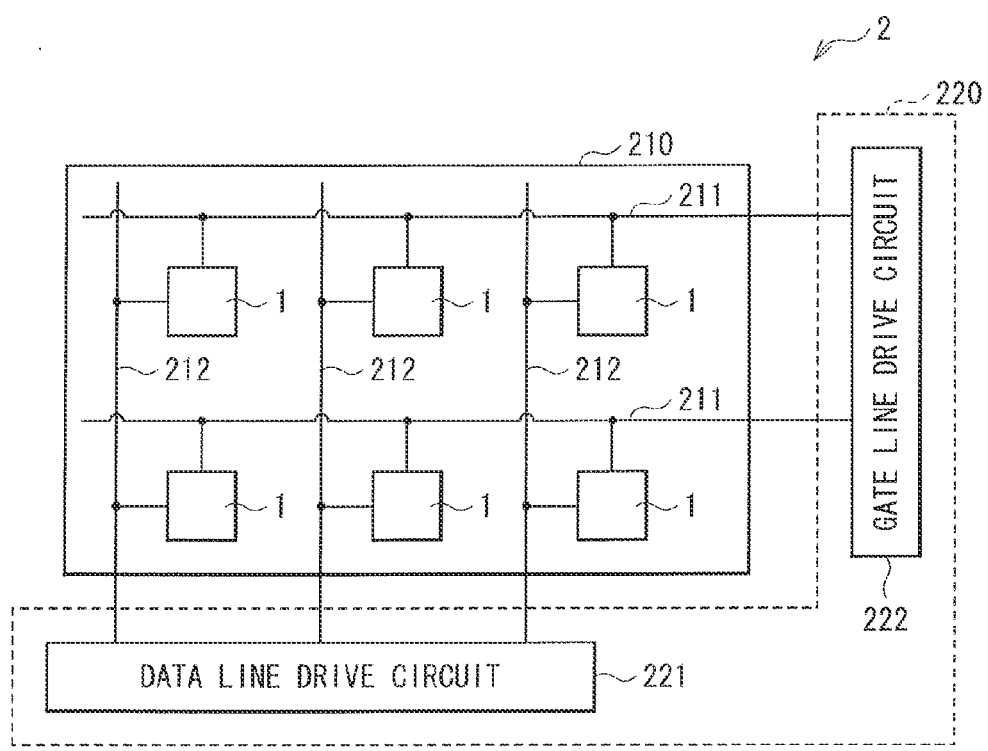
FIG. 27 is a functional block diagram illustrating a configuration example of the display unit of FIG. 24.
Figure 28:
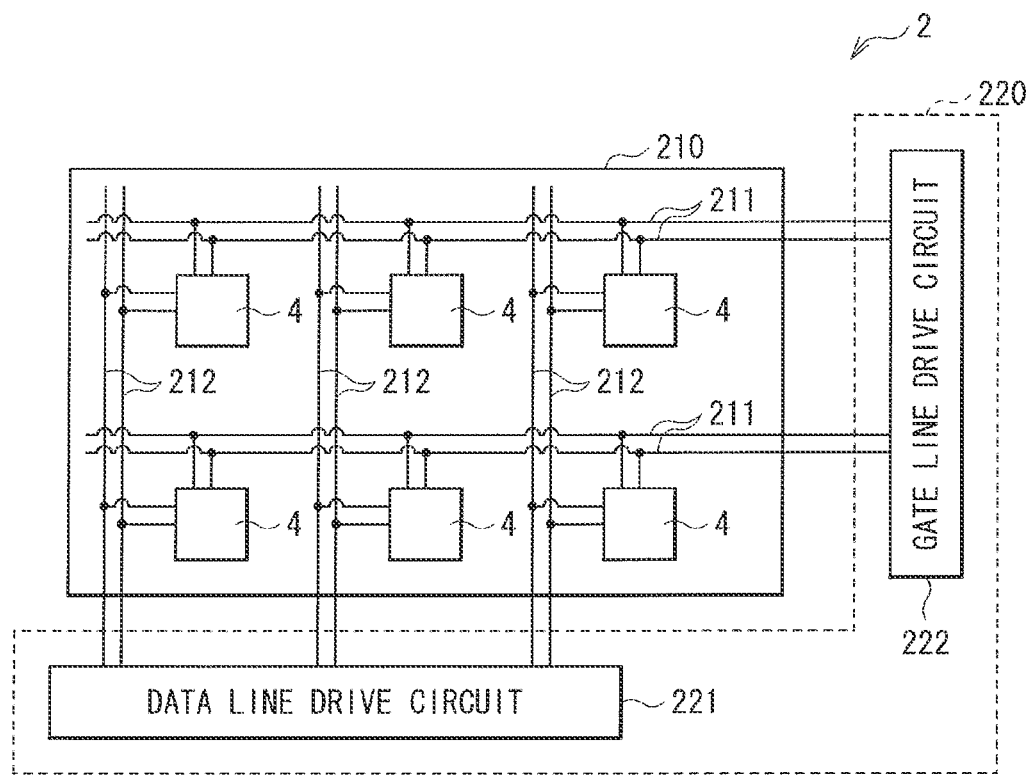
FIG. 28 is a functional block diagram illustrating another configuration example of the display unit of FIG. 24

The driver IC 220 drives a plurality of pixel chips 1 based on a video signal inputted from the outside. For example, as illustrated in FIGS. 27 and 28, the driver IC 220 has a data line drive circuit 221 connected to the wiring 212 and a gate line drive circuit 222 connected to the wiring 211. The gate line drive circuit 222 selects, for example, the light emitting devices 10 in the pixel chip 1 or 4 for every line. The data line drive circuit 221 applies a signal voltage to the light emitting devices 10 in the pixel chip 1 or 4 selected by the gate line drive circuit 222 through the wiring 212.

[Method of Manufacturing Display Panel 210]

Next, a description will be given of an example of methods of manufacturing the display panel 210.

Figure 29:
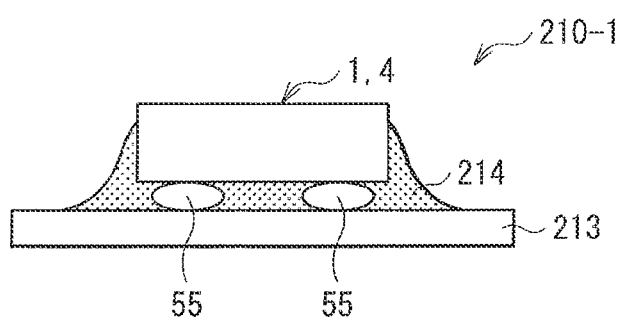
FIG. 29 is a cross-sectional view illustrating an example aspect of connection between a pixel chip of FIG. 25 or FIG. 26 and a wiring substrate.

First, for example, a circuit substrate (wiring substrate) in which the plurality of wirings 211 and 212 and pad electrodes that are connected to the wirings 211 and 212 and that are used for mounting the pixel chip 1 or 4 are provided on a base material is prepared. Next, the pixel chip 1 or 4 is mounted on the respective pad electrodes of the circuit substrate. After that, the circuit substrate is subjected to reflow, and the pad electrode 54 of the pixel chip 1 or 4 is jointed to the pad electrode of the circuit substrate with the solder ball 55 (second connection section) in between. Thereby, the pixel chip 1 or 4 and the circuit substrate are electrically connected through the solder ball 55, and thus the mounting substrate 210-1 is formed. After that, for example, as illustrated in FIG. 29, a space between a circuit substrate 213 and the pixel chip 1 or 4 and a side surface of the pixel chip 1 or 4 may be covered with a light shielding member 214 (second shielding section). Next, the mounting substrate 210-1 and the transparent substrate 210-2 are opposed to each other and are bonded with each other. Accordingly, the display panel 210 is manufactured.

[Operation and Effect of Display Unit 2]

In this embodiment, the pixel chip 1 or 4 is driven by the driver IC 220 through the wirings 211 and 212. Thereby, a current is sequentially supplied to the light emitting devices 10 in the pixel chip 1 or 4, and an image is displayed on the display region 210A.

In this embodiment, the pixel chip 1 or 4 is used as a display pixel. Thereby, a display unit with no fault lighting and superior display quality is allowed to be realized.

[4. Third Embodiment]
[Configuration]

Figure 30:
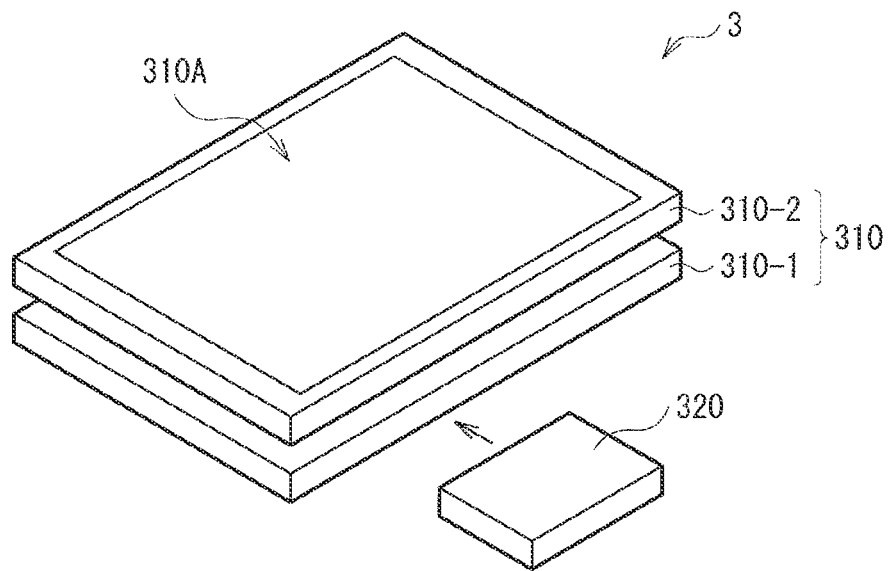
FIG. 30 is a perspective view illustrating a configuration example of a lighting unit according to a third embodiment of the present technology.

Next, a description will be given of a lighting unit 3 according to a third embodiment. The lighting unit 3 includes the pixel chip 1 according to the foregoing embodiment and the modifications thereof as a light source. FIG. 30 is a perspective view of an example of a schematic configuration of the lighting unit 3. The lighting unit 3 is what we call an LED lighting, in which an LED is used as a light source. For example, as illustrated in FIG. 30, the lighting unit 3 includes a lighting panel 310 and a driver IC 320 that drives the lighting panel 310.

(Lighting Panel 310)

In the lighting panel 310, a mounting substrate 310-1 and a transparent substrate 310-2 are layered on each other. A surface of the transparent substrate 310-2 is a surface from which illumination light is outputted, including a lighting region 310A on the central section thereof.

(Mounting Substrate 310-1)

Figure 31:
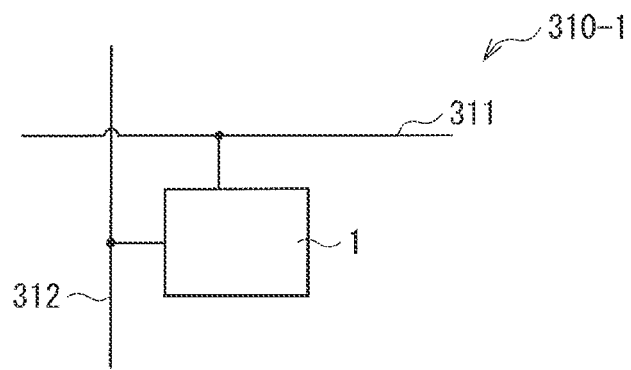
FIG. 31 is a plan view illustrating a layout example of a surface of a mounting substrate of FIG. 30.
Figure 32:
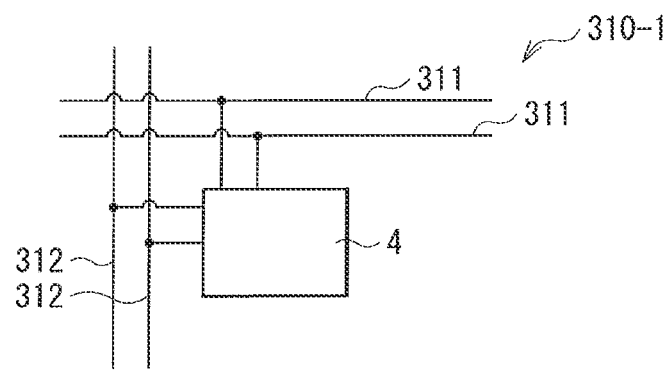
FIG. 32 is a plan view illustrating another layout example of the surface of the mounting substrate of FIG. 30.

FIG. 31 illustrates a layout example of a region corresponding to the lighting region 310A out of the surface on the transparent substrate 310-2 side of the mounting substrate 310-1. For example, as illustrated in FIG. 31, the mounting substrate 310-1 has wirings 311 and 312 extending in a given direction in the region corresponding to the lighting region 310A. The wiring 311 includes a gate line and the like, and the wiring 312 includes a data line and the like. The wiring 311 intersects with the wiring 312, and the pixel chip 1 functioning as a lighting pixel is provided in a section where one wiring 311 intersects with one wiring 312. In this case, the plurality of pixel chips 1 is two-dimensionally arranged in a region corresponding to the lighting region 310A of the mounting substrate 310-1. The pixel chip 1 is electrically connected to the wirings 311 and 312. Incidentally, in the case where the pixel chip 4 is used as the lighting pixel, the pixel chip 4 functioning as the lighting pixel is provided in a section where the plurality of wirings 311 intersects with the plurality of wirings 312. In this case, the plurality of pixel chips 4 is two-dimensionally arranged in a region corresponding to the lighting region 310A of the mounting substrate 310-1. Herein, in the case where the pixel chip 4 includes m×n pieces of light emitting devices 10 which are arranged in a matrix of m×n, the pixie chip 4 is provided in a section where m pieces of wirings 311 intersect with n pieces of wirings 312, and one wiring 311 is allocated to one row in the pixel chip 4 and one wiring 312 is allocated to one column in the pixel chip 4. Note that in FIG. 32, exemplified is a case where the pixel chip 4 includes four light emitting devices 10 arranged in a matrix of 2×2, and the pixel chip 4 is arranged in a section where two wirings 311 intersect with two wirings 312.

(Transparent Substrate 310-2)

The transparent substrate 310-2 is composed of a glass substrate, a resin substrate, or the like. In the transparent substrate 310-2, a surface on the pixel chip 1 side may be flat, or may be a rough surface.

(Driver IC 320)

Figure 33:
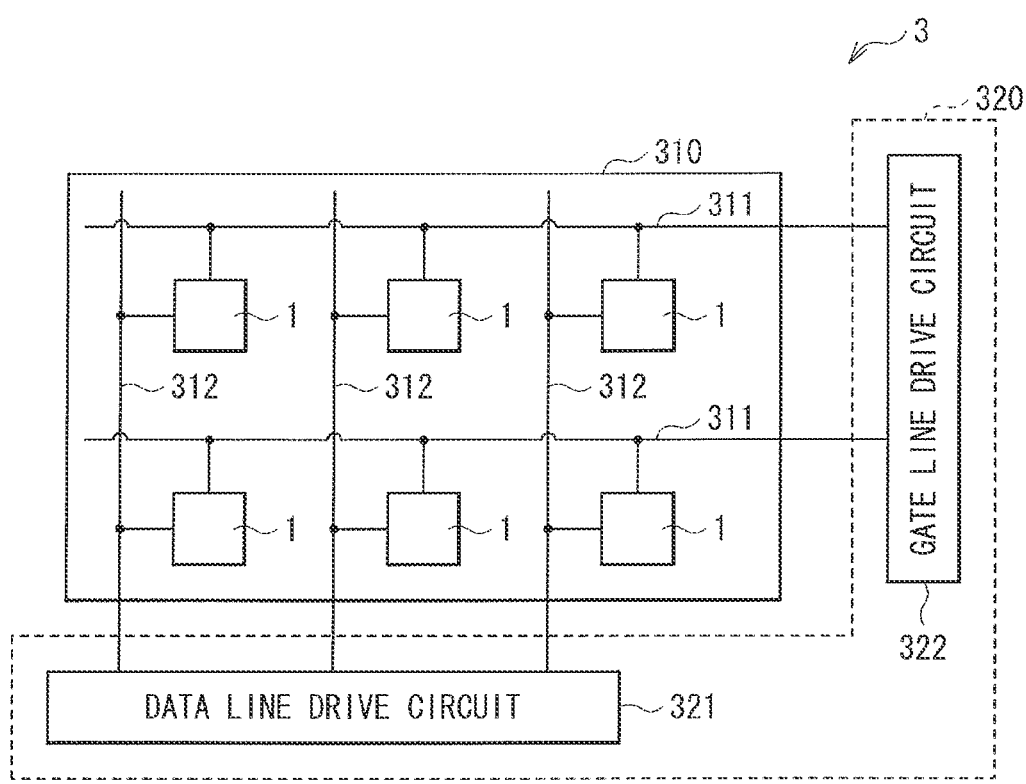
FIG. 33 is a functional block diagram illustrating a configuration example of the lighting unit of FIG. 30.
Figure 34:
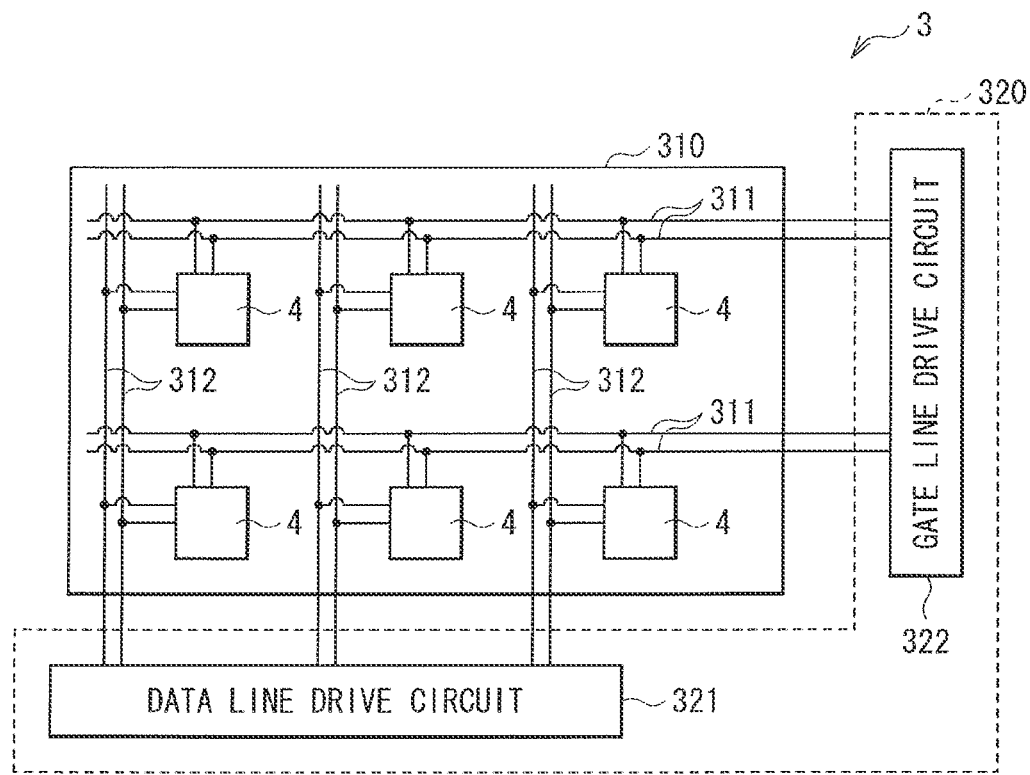
FIG. 34 is a functional block diagram illustrating another configuration example of the lighting unit of FIG. 30.

The driver IC 320 drives a plurality of pixel chips 1 based on a control signal inputted from the outside. For example, as illustrated in FIGS. 33 and 34, the driver IC 320 has a data line drive circuit 321 connected to the wiring 312 and a gate line drive circuit 322 connected to the wiring 311. The gate line drive circuit 322 selects, for example, the light emitting devices 10 in the pixel chip 1 or 4 for every line. The data line drive circuit 321 applies a signal voltage to the light emitting devices 10 in the pixel chip 1 or 4 selected by the gate line drive circuit 322 through the wiring 312.

[Method of Manufacturing Lighting Panel 310]

Next, a description will be given of an example of methods of manufacturing the lighting panel 310.

Figure 35:
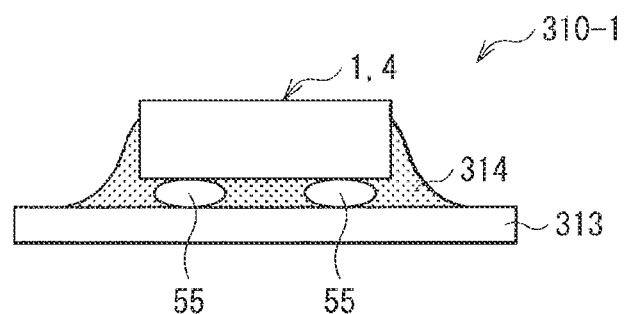
FIG. 35 is a cross-sectional view illustrating an aspect example of connection between a pixel chip of FIG. 31 or FIG. 32 and a wiring substrate.

First, for example, a circuit substrate (wiring substrate) in which the plurality of wirings 311 and 312 and pad electrodes that are connected to the wirings 311 and 312 and that are used for mounting the pixel chip 1 or 4 are provided on a base material is prepared. Next, the pixel chip 1 or 4 is mounted on the respective pad electrodes of the circuit substrate. After that, the circuit substrate is subjected to reflow, and the pad electrode 54 of the pixel chip 1 or 4 is jointed to the pad electrode of the circuit substrate with the solder ball 55 in between. Thereby, the pixel chip 1 or 4 and the circuit substrate are electrically connected through the solder ball 55, and thus the mounting substrate 310-1 is formed. After that, for example, as illustrated in FIG. 35, a space between a circuit substrate 313 and the pixel chip 1 or 4 and a side surface of the pixel chip 1 or 4 may be covered with a light shielding member 314. Next, the mounting substrate 310-1 and the transparent substrate 310-2 are opposed to each other and are bonded with each other. Accordingly, the lighting panel 310 is manufactured.

[Operation and Effect of Lighting Unit 3]

In this embodiment, the pixel chip 1 or 4 is driven by the driver IC 320 through the wirings 311 and 312. Thereby, a current is sequentially supplied to the pixel chip 1 or 4, and illumination light is outputted from the lighting region 310A.

In this embodiment, the pixel chip 1 or 4 is used as a lighting pixel. Thereby, a lighting unit with no fault lighting and superior lighting quality is allowed to be realized.

While the present technology has been described with reference to the plurality of embodiments and the modifications thereof, the present disclosure is not limited to the foregoing embodiments and the like, and various modifications may be made.

For example, in the foregoing embodiments and the like, the plurality of pixel chips 1 or 4 are mounted in a state of matrix on the mounting substrates 210-1 and 310-1. However, the plurality of pixel chips 1 or 4 may be mounted in a state of line on the mounting substrates 210-1 and 310-1. Further, in the foregoing embodiments and the like, for the mounting substrates 210-1 and 310-1, the wirings 211 and 212 or the wirings 311 and 312 that are arranged in a simple matrix are used as a wiring that drives the pixel chip 1 or 4. However, other wiring pattern may be used.

Figure 36:
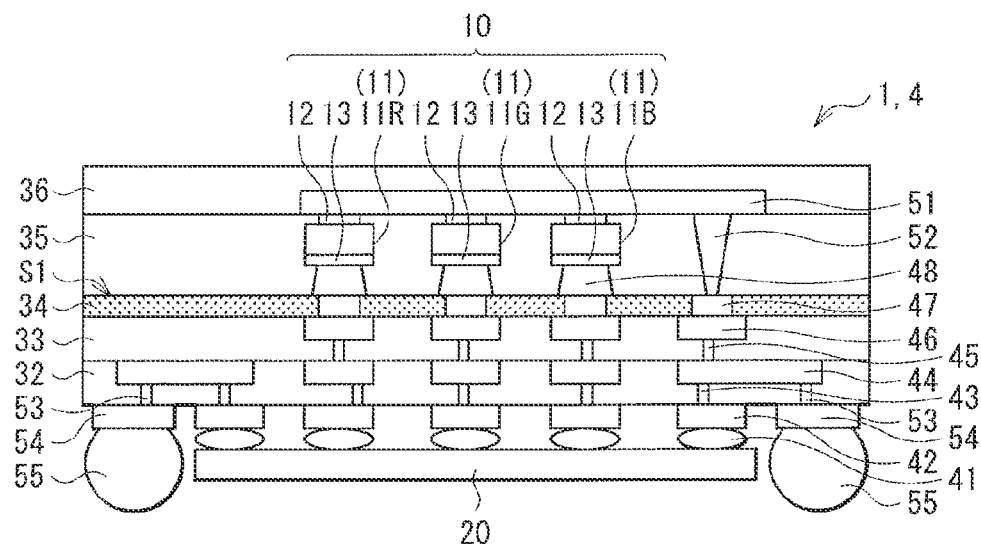
FIG. 36 is a cross-sectional view illustrating another modification of the configuration of the pixel chip of FIGS. 1A and 1B or FIGS. 23A and 23B.
Figure 37:
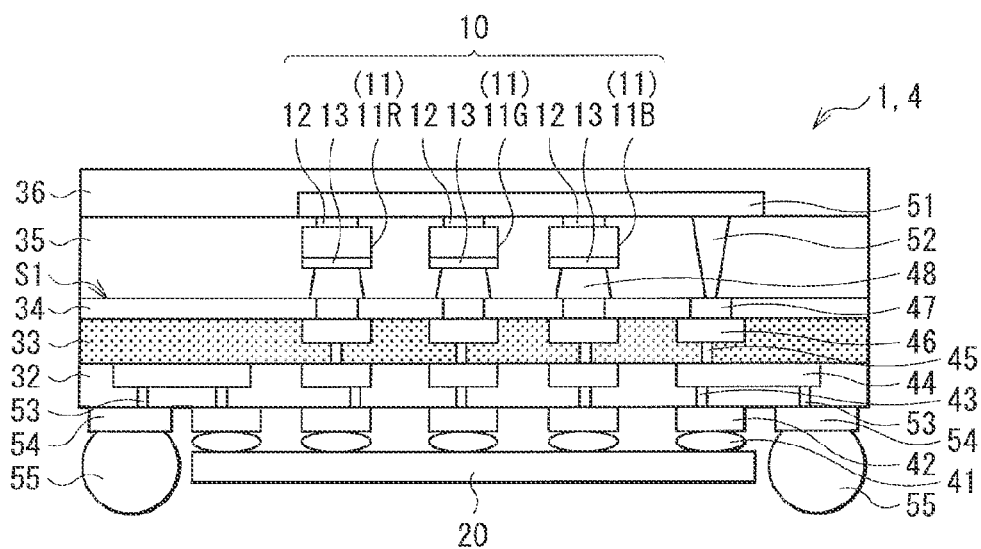
FIG. 37 is a cross-sectional view illustrating another modification of the configuration of the pixel chip of FIG. 12 or FIGS. 23A and 23B.

For example, in the foregoing embodiments and the like, the driver IC 20 is covered with the insulating layers 31 and 37. However, the entire driver IC 20 or a part of the driver IC 20 may be exposed to outside of the pixel chip 1 or 4 as illustrated in FIGS. 36 and 37. In this case, the insulating layers 31 and 37 are omitted, the via 53 is formed only in the insulating layer 32, the pad electrode 54 is formed in contact with the bottom surface of the insulating layer 32, and the solder ball 55 is formed to have a height higher than that of the driver IC 20.

It is possible to achieve at least the following configurations from the above-described exemplary embodiments and the modifications of the technology.

(1) A pixel chip including:
one or a plurality of light emitting devices;
a driver IC driving the light emitting devices;

a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

(2) The pixel chip according to (1), wherein the light shielding section is made of a resin added with a light-absorbing material.

(3) The pixel chip according to (1) or (2), further including:

a columnar electric conductor that is electrically connected to the connection section, and is arranged in a circumferential edge of the driver IC; and a pad electrode that is electrically connected to the columnar electric conductor, and functions as an input/output terminal of the pixel chip.

(4) The pixel chip according to (3), further including:

a light emission surface on a surface on the light emitting device side; and an input/output terminal surface on a surface on the driver IC side, wherein the pad electrode is arranged on the input/output terminal surface.

(5) The pixel chip according to any one of (1) to (4), wherein the one or plurality of light emitting devices configures one pixel, the driver IC is disposed at a center of the pixel chip, and the light emitting devices are disposed in a region opposed to a top surface of the driver IC.

(6) The pixel chip according to any one of (1) to (4), wherein the plurality of light emitting devices configures a plurality of pixels, the driver IC is disposed at a center of the pixel chip, and the light emitting devices are provided in a region not opposed to a top surface of the driver IC and on a periphery of the pixel chip.

(7) A display panel including a plurality of pixel chips two-dimensionally arranged on a wiring substrate in a display region, each of the pixel chips including:

one or a plurality of light emitting devices;

a driver IC driving the light emitting devices;

a first connection section that is arranged between the light emitting devices and the driver IC, and electrically connects the light emitting devices to the driver IC; and a first light shielding section that is arranged between the light emitting devices and the driver IC, and blocks direct entrance of light emitted from each of the light emitting devices into the driver IC together with the first connection section.

(8) The display panel according to (7) further including:

a second connection section that electrically connects the wiring substrate to the pixel chips; and a second light shielding section that covers the second connection section.

(9) A lighting panel including a plurality of pixel chips two-dimensionally arranged on a wiring substrate in a lighting region, each of the pixel chips including:

one or a plurality of light emitting devices;

a driver IC driving the light emitting devices;

a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

(10) A display unit including a display panel having a plurality of pixel chips two-dimensionally arranged on a wiring substrate in a display region, and a drive circuit that drives the pixel chips, each of the pixel chips including:

one or a plurality of light emitting devices;

a driver IC driving the light emitting devices;

a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting devices into the driver IC together with the connection section.

(11) A lighting unit including a lighting panel having a plurality of pixel chips two-dimensionally arranged on a wiring substrate in a lighting region, and a drive circuit that drives the pixel chips, each of the pixel chips including:

one or a plurality of light emitting devices;

a driver IC driving the light emitting devices;

a connection section that is arranged between the light emitting devices and the driver IC, and electrically connects the light emitting devices to the driver IC; and a light shielding section that is arranged between the light emitting devices and the driver IC, and blocks direct entrance of light emitted from each of the light emitting device into the driver IC together with the connection section.

The present disclosure contains subject matter related to that disclosed in Japanese Priority Patent Application JP 2011-086825 filed in the Japanese Patent Office on Apr. 8, 2011, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A pixel chip comprising:
   one or a plurality of light emitting devices;
   a driver IC driving the light emitting devices;
   a connection section that is arranged between the light emitting devices and the driver IC, and electrically connects the light emitting devices to the driver IC; and
   a light shielding section that is arranged between the light emitting devices and the driver IC, and blocks direct entrance of light emitted from each of the light emitting devices into the driver IC.

2. The pixel chip according to claim 1, wherein the light shielding section is made of a resin added with a light-absorbing material.

3. The pixel chip according to claim 1, further comprising:
   a columnar electric conductor that is electrically connected to the connection section, and is arranged in a circumferential edge of the driver IC; and
   a pad electrode that is electrically connected to the columnar electric conductor, and functions as an input/output terminal of the pixel chip.

4. The pixel chip according to claim 3, further comprising:
   a light emission surface on a surface on the light emitting device side; and
   an input/output terminal surface on a surface on the driver IC side,
   wherein the pad electrode is arranged on the input/output terminal surface.

5. The pixel chip according to claim 1, wherein
the one or plurality of light emitting devices configures one pixel,
the driver IC is disposed at a center of the pixel chip, and
the light emitting devices are disposed in a region opposed to a top surface of the driver IC.

6. The pixel chip according to claim 1, wherein
the plurality of light emitting devices configures a plurality of pixels,
the driver IC is disposed at a center of the pixel chip, and
the light emitting devices are provided in a region not opposed to a top surface of the driver IC and on a periphery of the pixel chip.

7. The pixel chip according to claim 1, wherein the connection section blocks the light emitted from each of the light emitting devices into the driver IC.

8. A display panel including a plurality of pixel chips two-dimensionally arranged on a wiring substrate in a display region, each of the pixel chips comprising:
one or a plurality of light emitting devices;
a driver IC driving the light emitting devices;
a first connection section that is arranged between the light emitting devices and the driver IC, and electrically connects the light emitting devices to the driver IC; and
a first light shielding section that is arranged between the light emitting devices and the driver IC, and blocks direct entrance of light emitted from each of the light emitting devices into the driver IC.

9. The display panel according to claim 8 further comprising:
a second connection section that electrically connects the wiring substrate to the pixel chips; and
a second light shielding section that covers the second connection section.

10. The display panel according to claim 8, further comprising:
a columnar electric conductor that is electrically connected to the first connection section, and is arranged in a circumferential edge of the driver IC; and
a pad electrode that is electrically connected to the columnar electric conductor, and functions as an input/output terminal of the pixel chip.

11. The display panel according to claim 10, further comprising:
a light emission surface on a surface on the light emitting device side; and
an input/output terminal surface on a surface on the driver IC side,
wherein the pad electrode is arranged on the input/output terminal surface.

12. The display panel according to claim 8, wherein
the one or plurality of light emitting devices configures one pixel,
the driver IC is disposed at a center of the pixel chip, and
the light emitting devices are disposed in a region opposed to a top surface of the driver IC.

13. The display panel according to claim 8, wherein
the plurality of light emitting devices configures a plurality of pixels,
the driver IC is disposed at a center of the pixel chip, and
the light emitting devices are provided in a region not opposed to a top surface of the driver IC and on a periphery of the pixel chip.

14. The display panel according to claim 8, wherein the first connection section blocks the light emitted from each of the light emitting devices into the driver IC.

15. A lighting panel including a plurality of pixel chips two-dimensionally arranged on a wiring substrate in a lighting region, each of the pixel chips comprising:
one or a plurality of light emitting devices;
a driver IC driving the light emitting devices;
a connection section that is arranged between the light emitting devices and the driver IC, and electrically connects the light emitting devices to the driver IC; and
a light shielding section that is arranged between the light emitting devices and the driver IC, and blocks direct entrance of light emitted from each of the light emitting devices into the driver IC.

16. The lighting panel according to claim 15, wherein the connection section blocks the light emitted from each of the light emitting devices into the driver IC.

17. A display unit including a display panel having a plurality of pixel chips two-dimensionally arranged on a wiring substrate in a display region, and a drive circuit that drives the pixel chips, each of the pixel chips comprising:
one or a plurality of light emitting devices;
a driver IC driving the light emitting devices;
a connection section that is arranged between the light emitting devices and the driver IC, and electrically connects the light emitting devices to the driver IC; and
a light shielding section that is arranged between the light emitting devices and the driver IC, and blocks direct entrance of light emitted from each of the light emitting devices into the driver IC.

18. The display unit according to claim 17, wherein the connection section blocks the light emitted from each of the light emitting devices into the driver IC.

19. A lighting unit including a lighting panel having a plurality of pixel chips two-dimensionally arranged on a wiring substrate in a lighting region, and a drive circuit that drives the pixel chips, each of the pixel chips comprising:
one or a plurality of light emitting devices;
a driver IC driving the light emitting devices;
a connection section that is arranged between the light emitting devices and the driver IC, and electrically connects the light emitting devices to the driver IC; and
a light shielding section that is arranged between the light emitting devices and the driver IC, and blocks direct entrance of light emitted from the light emitting device into the driver IC.

20. The lighting unit according to claim 19, wherein the connection section blocks the light emitted from each of the light emitting devices into the driver IC.

* * * * *